(12) United States Patent
Nakai

(10) Patent No.: US 11,811,373 B2
(45) Date of Patent: Nov. 7, 2023

(54) CLASS AB AMPLIFIER AND OPERATIONAL AMPLIFIER

(71) Applicant: Mitsubishi Electric Corporation, Tokyo (JP)

(72) Inventor: Takayuki Nakai, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 274 days.

(21) Appl. No.: 17/291,673

(22) PCT Filed: Dec. 19, 2018

(86) PCT No.: PCT/JP2018/046795
§ 371 (c)(1),
(2) Date: May 6, 2021

(87) PCT Pub. No.: WO2020/129184
PCT Pub. Date: Jun. 25, 2020

(65) Prior Publication Data
US 2022/0006434 A1   Jan. 6, 2022

(51) Int. Cl.
*H03F 3/45*  (2006.01)
*H03F 1/02*  (2006.01)
*H03F 3/26*  (2006.01)

(52) U.S. Cl.
CPC .......... *H03F 3/45179* (2013.01); *H03F 1/02* (2013.01); *H03F 3/265* (2013.01)

(58) Field of Classification Search
CPC ........ H03F 3/45179; H03F 1/02; H03F 3/265; H03F 3/3028; H03F 3/45192; H03F 3/3022; H03F 3/45183

(Continued)

(56) References Cited

U.S. PATENT DOCUMENTS 5,673,002 A   9/1997   Kobayashi et al.
5,844,442 A   12/1998  Brehmer
(Continued)

FOREIGN PATENT DOCUMENTS

JP   H05283950 A   10/1993
JP   H0786850 A    3/1995
(Continued)

OTHER PUBLICATIONS

Office Action issued in corresponding Japanese Patent Application No. 2020-560703, dated Nov. 22, 2022, 10 Pages including 5 pages of English Translation.

(Continued)

*Primary Examiner* — Khanh V Nguyen
(74) *Attorney, Agent, or Firm* — BUCHANAN INGERSOLL & ROONEY PC

(57) ABSTRACT

An active load stage converts a first input current and a second input current into a first voltage and a second voltage. A driver amplifier operates upon receiving the first voltage and the second voltage from the active load stage, and outputs a current to an output terminal. The driver amplifier has a first transistor and a second transistor connected in series between a first reference potential terminal and a second reference potential terminal. The first transistor receives the first voltage at a gate and passes a first current, and the second transistor receives the second voltage at a gate and passes a second current. A minimum selector provides feedback to the first voltage and the second voltage such that an absolute value of each of the first current and the second current becomes more than or equal to a quiescent current of the driver amplifier.

9 Claims, 13 Drawing Sheets

(58) Field of Classification Search
USPC .................................................. 330/253, 255
See application file for complete search history.

(56) References Cited

U.S. PATENT DOCUMENTS

| | | | | |
|---|---|---|---|---|
| 6,150,883 | A * | 11/2000 | Ivanov | H03F 3/3028 330/253 |
| 6,208,208 | B1 | 3/2001 | Komatsu et al. | |
| 6,542,033 | B2 * | 4/2003 | Maejima | H03F 3/45192 330/261 |
| 7,800,447 | B2 * | 9/2010 | Bandyopadhyay | H03F 3/45475 330/267 |
| 8,665,024 | B2 * | 3/2014 | Huffenus | H03F 3/3001 330/273 |
| 10,187,012 | B1 * | 1/2019 | Radhakrishnan Kulasekaran | H03F 3/301 |
| 10,461,707 | B2 * | 10/2019 | Ivanov | H03F 1/0233 |
| 2016/0087727 | A1 | 3/2016 | Nagatani et al. | |
| 2020/0343868 | A1 | 10/2020 | Nakai | |

FOREIGN PATENT DOCUMENTS

| | | |
|---|---|---|
| JP | H0823247 A | 1/1996 |
| JP | H11308057 A | 11/1999 |
| JP | 2002208854 A | 7/2002 |
| JP | 2011023924 A | 2/2011 |
| JP | 6338807 B1 | 6/2018 |
| WO | 2014181869 A1 | 11/2014 |

OTHER PUBLICATIONS

International Search Report (PCT/ISA/210) with translation and Written Opinion (PCT/ISA/237) dated Mar. 19, 2019, by the Japan Patent Office as the International Searching Authority for International Application No. PCT/JP2018/046795.

Langen, et al., "Compact Low-Voltage and High-Speed CMOS, BiCMOS and Bipolar Operational Amplifiers", Kluwer Academic Publishers, p. 79, 2010.

* cited by examiner

CLASS AB AMPLIFIER AND OPERATIONAL AMPLIFIER

TECHNICAL FIELD

The present disclosure relates to a class AB amplifier and an operational amplifier.

BACKGROUND ART

There is known a technique of using a feedback-type class AB amplifier for an output stage, as a circuit configuration for suppressing a quiescent current when an operational amplifier is in a quiescent state and supplying a current exceeding the quiescent current to a load when the operational amplifier is in a load driving state (see, for example, NPL 1).

The feedback-type class AB amplifier described in NPL 1 has: a driver amplifier constituted by first and second transistors connected in series; an active load to amplify a difference between a first input current inputted to an inverting input terminal and a second input current inputted to a non-inverting input terminal, and generate gate voltages to be inputted to gates of the first and second transistors; and a minimum selector to provide feedback to the gate voltages of the first and second transistors such that currents passing through the first and second transistors do not become lower than a specified value.

CITATION LIST

Non Patent Literature

NPL 1: "COMPACT LOW-VOLTAGE AND HIGH-SPEED CMOS, BiCMOS AND BIPOLAR OPERATIONAL AMPLIFIERS", P. 79, Klaas-Jan de Langen, etc., Kluwer Academic Publishers

SUMMARY OF INVENTION

Technical Problem

However, in the operational amplifier described in NPL 1, when one of the first and second transistors constituting the driver amplifier is in the load driving state, the current passing through the other transistor which is in the quiescent state is controlled to a minimum current that is smaller than the quiescent current when the operational amplifier is in the quiescent state.

If the value of the minimum current is decreased in such a configuration, distortion of the operational amplifier becomes worse, and there is a concern that signal quality may be deteriorated in analog signal processing in communication or sensing. On the other hand, if the value of the minimum current is increased to ensure signal quality, the value of the quiescent current is also increased, causing an increase in consumed current. Thus, regarding the value of the minimum current, the operational amplifier described in NPL 1 has a trade-off between the signal quality and the consumed current.

Accordingly, an object of the present disclosure is to provide a class AB amplifier in which currents passing through transistors constituting a driver amplifier do not become lower than a quiescent current of the driver amplifier, and an operational amplifier using the same.

Solution to Problem

A class AB amplifier in accordance with the present disclosure includes: a first input terminal to receive a first input current; a second input terminal to receive a second input current; an output terminal; a first reference potential terminal; a second reference potential terminal; an active load stage to receive the first input current and the second input current, and convert the first input current and the second input current into a first voltage and a second voltage; and a driver amplifier to operate upon receiving the first voltage and the second voltage from the active load stage, and output a current to the output terminal. The driver amplifier has a first transistor and a second transistor connected in series between the first reference potential terminal and the second reference potential terminal, and connects a connection point between the first transistor and the second transistor to the output terminal. The first transistor receives the first voltage at a gate and passes a first current, and the second transistor receives the second voltage at a gate and passes a second current. The class AB amplifier further includes a minimum selector to provide feedback to the first voltage and the second voltage such that an absolute value of each of the first current and the second current becomes more than or equal to a quiescent current of the driver amplifier.

Advantageous Effects of Invention

According to the present disclosure, a class AB amplifier in which currents passing through transistors constituting a driver amplifier do not become lower than a quiescent current of the driver amplifier, and an operational amplifier using the same can be provided.

DESCRIPTION OF EMBODIMENTS

Figure 1:
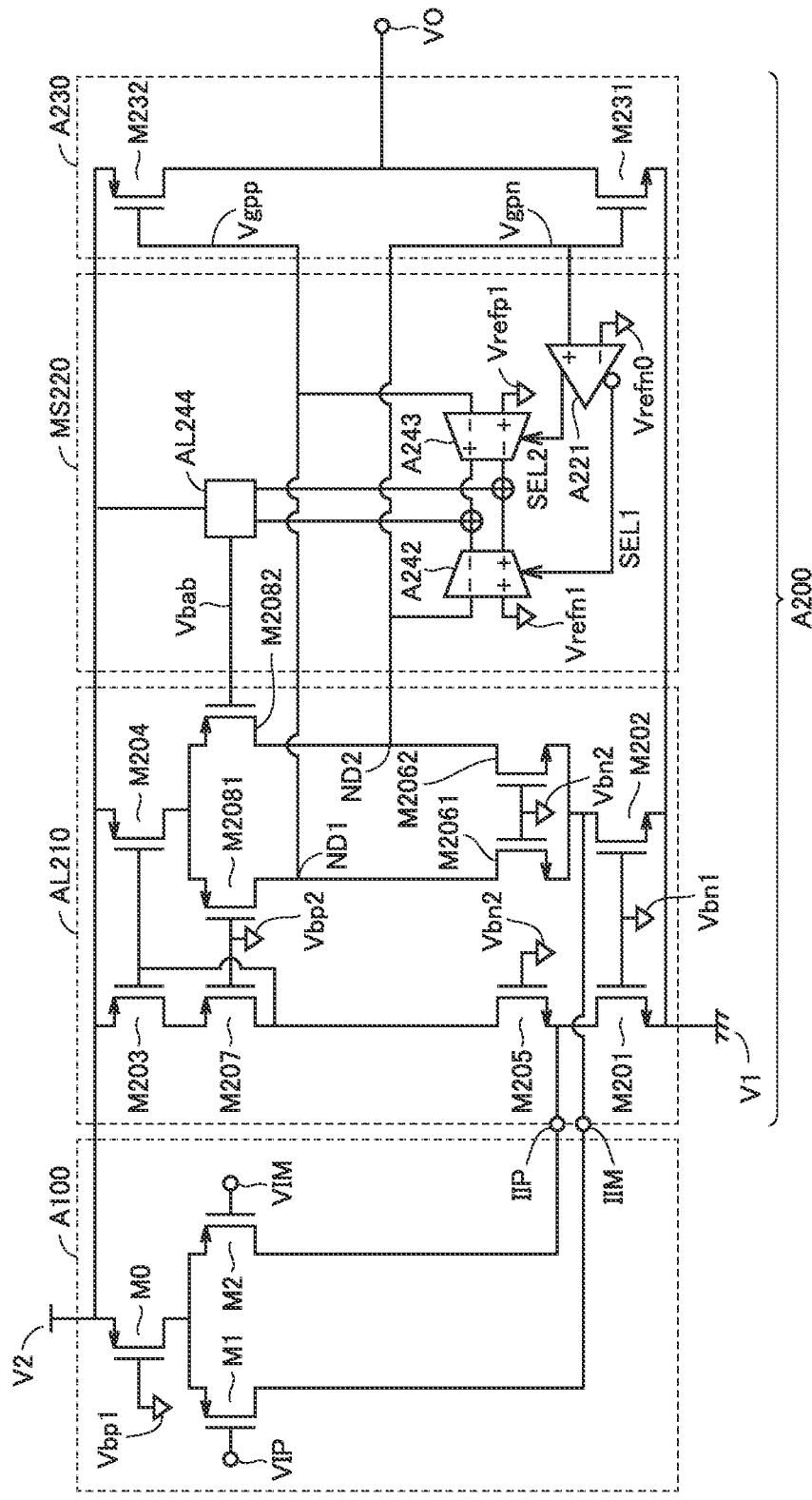
FIG. 1 is a view showing a configuration of an operational amplifier in accordance with a first embodiment.

Hereinafter, embodiments of the present disclosure will be described in detail with reference to the drawings. It should be noted that identical or corresponding parts in the drawings will be designated below by the same reference numerals, and the description thereof will not be repeated in principle. The following description describes a case where transistors include MOS (Metal Oxide Semiconductor) transistors.

First Reference Example

First, a configuration of an operational amplifier in accordance with a reference example and a problem thereof will be described.

Figure 11:
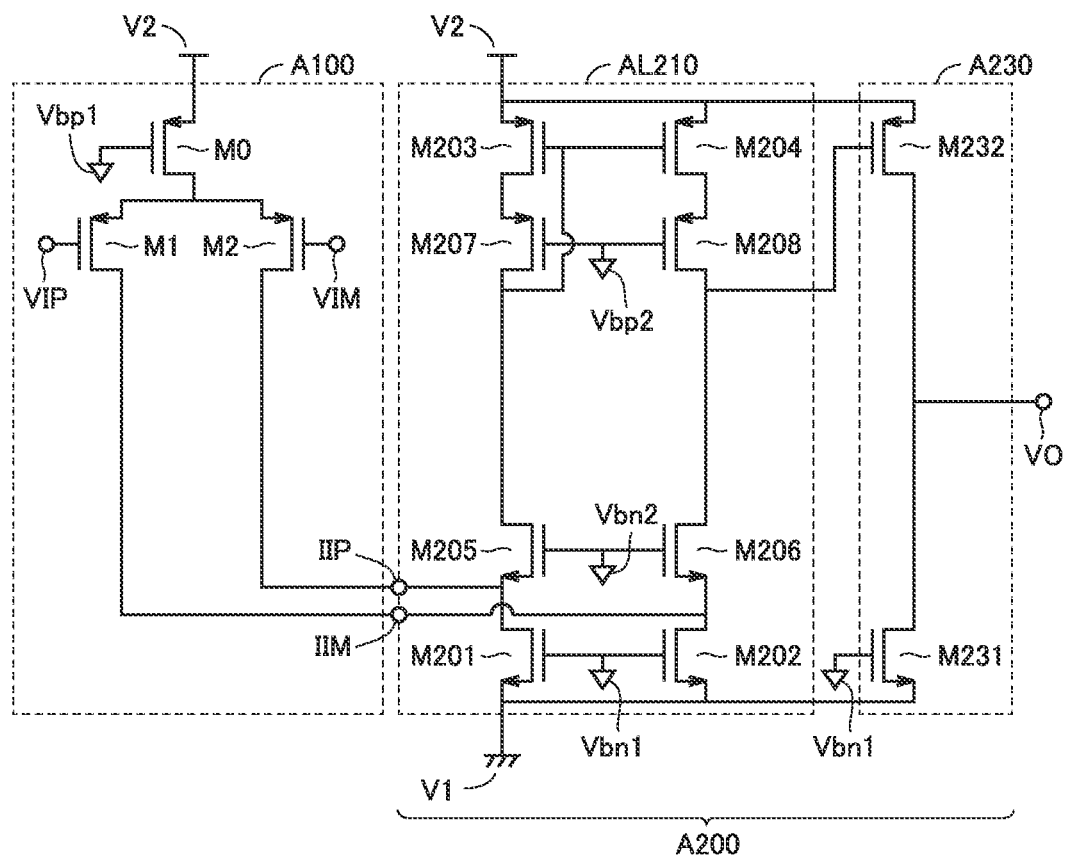
FIG. 11 is a view showing a configuration of an operational amplifier in accordance with a first reference example.

FIG. 11 is a view showing a configuration of an operational amplifier in accordance with a first reference example. The operational amplifier in accordance with the first reference example is a folded cascode-type operational amplifier including a class A amplifier, and amplifies a difference between potentials inputted to differential input terminals VIP and VIM and outputs the amplified potential difference to an output terminal VO.

The operational amplifier in accordance with the first reference example includes a differential input stage A100, an output stage A200, and reference potential terminals V1 and V2. In the specification of the present application, reference potential terminal V1 is referred to as a "first reference potential terminal V1", and reference potential terminal V2 is referred to as a "second reference potential terminal V2". The potential of first reference potential terminal V1 is lower than the potential of second reference potential terminal V2.

Differential input stage A100 has differential input terminals VIP and VIM, and transistors M0, M1, and M2. Differential input stage A100 converts a difference between a first potential inputted to non-inverting input terminal VIP and a second potential inputted to inverting input terminal VIM into a difference in current.

Transistors M0, M1, and M2 are N-type MOSFETs (Metal Oxide Semiconductor Field Effect Transistors). The source of transistor M0 is connected to second reference potential terminal V2. The gate of transistor M0 receives a control voltage Vbp1. Transistor M0 constitutes a constant current source.

The source of transistor M1 is connected to the drain of transistor M0, and the drain of transistor M1 is connected to a first input terminal IIM of output stage A200. The gate of transistor M1 is connected to non-inverting input terminal VIP and receives a first potential VIP. The source of transistor M2 is connected to the drain of transistor M0, and the drain of transistor M2 is connected to a second input terminal IIP of output stage A200. The gate of transistor M2 is connected to inverting input terminal VIM and receives a second potential VIM. Transistors M1 and M2 constitute a differential pair.

Output stage A200 has input terminals IIP and IIM, output terminal VO, an active load stage AL210, and a driver amplifier A230. First input terminal IIM receives a current passing through transistor M1. Second input terminal IIP receives a current passing through transistor M2.

Active load stage AL210 has transistors M201 and M202, transistors M203 and M204, and transistors M205, M206, M207, and M208. Transistors M201, M202, M205, and M206 are N-type MOSFETs. Transistors M203, M204, M207, and M208 are P-type MOSFETs. Transistors M201 and M202 constitute a constant current source. Transistors M203 and M204 constitute a current mirror circuit. The current mirror circuit outputs the difference in current generated in differential input stage A100 to driver amplifier A230. Transistors M205, M206, M207, and M208 constitute a cascode circuit. The cascode circuit increases the gain of the differential input stage by increasing the output resistance of the differential pair (transistors M1 and M2).

Transistor M203, transistor M207, transistor M205, and transistor M201 are connected in series between second reference potential terminal V2 and first reference potential terminal V1. Transistor M204, transistor M208, transistor M206, and transistor M202 are connected in series between second reference potential terminal V2 and first reference potential terminal V1. The gates of transistor M207 and transistor M208 receive a bias voltage Vbp2. The gates of transistor M205 and transistor M206 receive a bias voltage Vbn2. The gates of transistor M201 and transistor M202 receive a bias voltage Vbn1.

The connection point between the source of transistor M205 and the drain of transistor M201 is connected to second input terminal IIP. The connection point between the source of transistor M206 and the drain of transistor M202 is connected to first input terminal IIM. The connection point between the drain of transistor M208 and the drain of transistor M206 is connected to the gate of a transistor M232 of driver amplifier A230.

Driver amplifier A230 has transistors M231 and M232. Transistor M232 and transistor M231 are connected in series between second reference potential terminal V2 and first reference potential terminal V1. The connection point between the drain of transistor M232 and the drain of transistor M231 is connected to output terminal VO. Transistor M232 constitutes a grounded source amplification stage. Transistor M231 constitutes a current drawing load. Driver amplifier A230 has a role of increasing gain and drive capability.

Transistor M231 corresponds to one embodiment of a "first transistor", and transistor M232 corresponds to one embodiment of a "second transistor".

Second Reference Example

Figure 12:
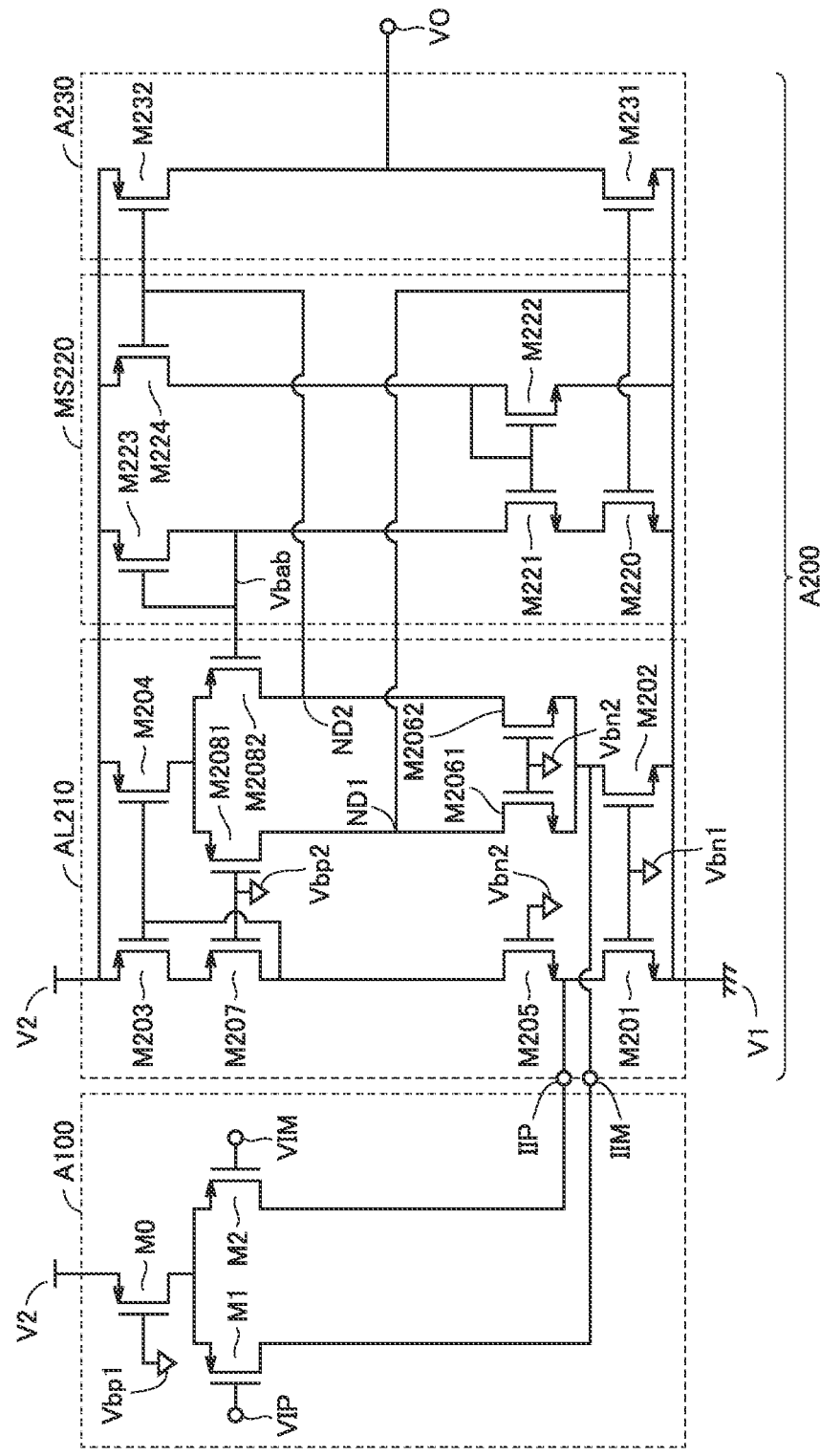
FIG. 12 is a view showing a configuration of an operational amplifier in accordance with a second reference example.

FIG. 12 is a view showing a configuration of an operational amplifier in accordance with a second reference example. The operational amplifier in accordance with the second reference example is an operational amplifier including a feedback-type class AB amplifier.

Referring to FIG. 12, the operational amplifier in accordance with the second reference example is different from the operational amplifier in accordance with the first reference example shown in FIG. 11 in the configuration of output stage A200. Output stage A200 of the second reference example has active load stage AL210, a minimum selector MS220, and driver amplifier A230. In active load stage AL210 of the second reference example, transistor M208 constituting the cascode circuit in active load stage AL210 of the first reference example is divided into a transistor M2081 and a transistor M2082, and transistor M206 constituting the cascode circuit in active load stage AL210 of the first reference example is divided into a transistor M2061 and a transistor M2062. A node ND1, which is the connection point between the drain of transistor M2081 and the drain of transistor M2061, is connected to the gate of transistor M231. A node ND2, which is the connection point between the drain of transistor M2082 and the drain of transistor M2062, is connected to the gate of transistor M232.

Transistor M2081 and transistor M2082 constitute a differential pair, and transistor M2061 and transistor M2062 constitute an active load. The differential pair and the active load constitute a differential amplifier. The differential amplifier functions as a "bias control amplifier" for controlling a bias control voltage Vbab to be generated in minimum selector MS220.

Minimum selector MS220 selects one of a current passing through M232 (the grounded source amplification stage) and a current passing through transistor M231 (the current drawing load) which has a smaller absolute value, and generates bias control voltage Vbab according to the selected current. Minimum selector MS220 has a role of providing feedback to bias control voltage Vbab such that the absolute value of the selected current does not become lower than a specified value.

Specifically, minimum selector MS220 has transistors M220, M221, and M222, and transistors M223 and M224. Transistors M220, M221, and M222 are N-type MOSFETs. Transistors M223 and M224 are P-type MOSFETs.

Transistor M223, transistor M221, and transistor M220 are connected in series between second reference potential terminal V2 and first reference potential terminal V1. More specifically, second reference potential terminal V2 is connected to the source of transistor M223. The drain of transistor M223 is connected to the drain of transistor M221. The source of transistor M221 is connected to the drain of transistor M220. The source of transistor M220 is connected to first reference potential terminal V1. The connection point between the drain of transistor M223 and the drain of transistor M221, and the gate of transistor M223 are connected to the gate of transistor M2082 of active load stage AL210. The gate of transistor M2082 receives bias control voltage Vbab generated in minimum selector MS220. The gate of transistor M220 is connected to the gate of transistor M231. Transistor M220 is a replica of transistor M231.

Transistor M224 and transistor M222 are connected in series between second reference potential terminal V2 and first reference potential terminal V1. More specifically, second reference potential terminal V2 is connected to the source of transistor M224. The drain of transistor M224 is connected to the drain of transistor M222. The source of transistor M222 is connected to first reference potential terminal V1. The gate of transistor M224 is connected to the gate of transistor M232. Transistor M224 is a replica of transistor M232. The drain and the gate of transistor M222 are connected to the gate of transistor M221. Transistor M221 and transistor M222 constitute a current mirror circuit.

Minimum selector MS220 monitors the current passing through transistor M232 (hereinafter also referred to as a "drain current IDS232") and the current passing through transistor M231 (hereinafter also referred to as a "drain current IDS231"), using replica transistors M220 and M224. The current mirror circuit constituted by transistors M221 and M222 selects one of drain current IDS232 and drain current IDS231 which has a smaller absolute value. In the following description, selected drain current IDS is also referred to as a "minimum drain current IDSmin". That is, IDSmin=min(|IDS231|, |IDS232|) holds.

Minimum selector MS220 generates bias control voltage Vbab according to minimum drain current IDSmin, by passing minimum drain current IDSmin through diode-connected transistor M223. Minimum selector MS220 outputs the generated bias control voltage Vbab to the bias control amplifier within active load stage AL210.

As described above, the bias control amplifier has the differential pair constituted by transistor M2081 and transistor M2082. The gate of transistor M2081 receives reference voltage Vbp2. The gate of transistor M2082 receives bias control voltage Vbab. Reference voltage Vbp2 is set to a voltage corresponding to an idling current (hereinafter also referred to as a "quiescent current IQ") in a state where the operational amplifier is not driving a load (hereinafter also referred to as a "quiescent state").

When bias control voltage Vbab is larger than reference voltage Vbp2, that is, when minimum drain current IDSmin is smaller than quiescent current IQ, the bias control amplifier increases the potential of node ND1 and decreases the potential of node ND2, that is, decreases the gate voltage of transistor M231 and increases the gate voltage of transistor M232. Thereby, control for suppressing bias control voltage Vbab to reference voltage Vbp2 is performed.

On the other hand, when bias control voltage Vbab is smaller than reference voltage Vbp2, that is, when minimum drain current IDSmin is smaller than quiescent current IQ, the differential amplifier decreases the potential of node ND1 and increases the potential of node ND2, that is, increases the gate voltage of transistor M231 and decreases the gate voltage of transistor M232. Thereby, control for increasing bias control voltage Vbab to reference voltage Vbp2 is performed.

As described above, the bias control amplifier generates the gate voltages of transistor M231 and transistor M232 such that bias control voltage Vbab becomes equal to reference voltage Vbp2. Accordingly, when the operational amplifier is in the quiescent state, the absolute values of drain current IDS231 and drain current IDS232 are both controlled to become equal to quiescent current IQ.

On the other hand, when the operational amplifier is in a state where it is driving the load (hereinafter also referred to as a "load driving state"), either one of transistor M231 and transistor M232 is set to the load driving state, and the absolute value of drain current IDS thereof becomes larger than quiescent current IQ. Therefore, minimum selector MS220 detects drain current IDS of the other transistor which is not in the load driving state as minimum drain current IDSmin. The bias control amplifier generates the gate voltages of transistor M231 and transistor M232 such that bias control voltage Vbab becomes equal to reference voltage Vbp2, according to the same mechanism as that in the quiescent state described above. As a result, the other transistor is controlled to be set to a minimum current state. However, drain current IDS in the minimum current state has a value smaller than that of quiescent current IQ. Hereinafter, drain current IDS in the minimum current state is also referred to as a "minimum current IM".

Figure 13:
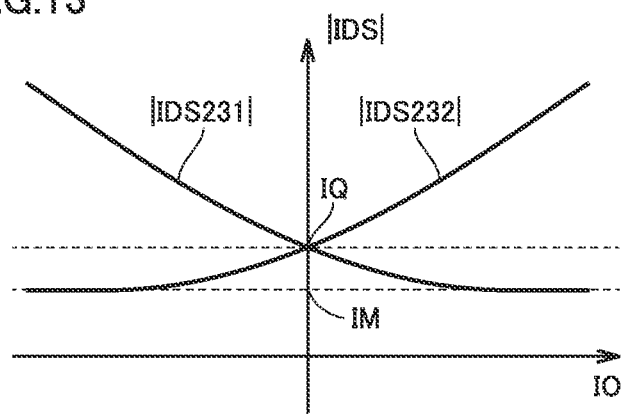
FIG. 13 is a view for describing the relation between drain currents of transistors and an output current of a driver amplifier in the operational amplifier in accordance with the second reference example.

FIG. 13 is a view for describing the relation between drain currents IDS of transistors M231 and M232 and an output current IO of driver amplifier A230 in the operational amplifier in accordance with the second reference example. FIG. 13 shows characteristic curves of the absolute value |IDS231| of the drain current of transistor M231 and the absolute value |IDS232| of the drain current of transistor M232. In FIG. 13, the axis of ordinates represents the absolute value |IDS| of each drain current, and the axis of abscissas represents output current IO from output terminal VO. Output current IO is positive in a direction in which the current flows out of output terminal VO, and is negative in a direction in which the current flows into output terminal VO.

As shown in FIG. 13, when the operational amplifier is in the quiescent state, that is, in the case of output current IO=0, the absolute values |IDS| of the drain currents of transistors M231 and M232 both indicate quiescent current IQ.

On the other hand, when either one of transistors M231 and M232 is in the load driving state, the other transistor is controlled to be set to the minimum current state. On this occasion, the absolute value |IDS| of the drain current of the other transistor is controlled to minimum current IM that is smaller than quiescent current IQ.

As described above, the operational amplifier in accordance with the second reference example ensures class AB operation by monitoring drain currents IDS passing through transistor M231 and transistor M232 of driver amplifier A230, and providing feedback such that drain currents IDS do not become lower than minimum current IM.

Problem of Operational Amplifier in Accordance with Second Reference Example

As shown in FIG. 13, in the operational amplifier in accordance with the second reference example, when either one of transistors M231 and M232 constituting driver amplifier A230 is in the load driving state, the absolute value of drain current IDS of the other transistor which is in the quiescent state is controlled to minimum current IM that is smaller than quiescent current IQ.

If the value of minimum current IM is decreased in such a configuration, distortion of the operational amplifier becomes worse, and there is a concern that signal quality may be deteriorated in analog signal processing in communication or sensing. On the other hand, if the value of minimum current IM is increased to ensure signal quality, the value of quiescent current IQ is also increased, causing an increase in consumed current. Thus, regarding the value of minimum current IM, the signal quality and the consumed current have a trade-off.

In addition, the operational amplifier in accordance with the second reference example has a plurality of current mirror circuits as components for achieving class AB operation. In a current mirror circuit, it is generally necessary to set a mirror ratio between an original transistor (a primary transistor) and a replica transistor (a secondary transistor) to be close to 1 as much as possible. It should be noted that the mirror ratio is a ratio between the drain current of the original transistor and the drain current of the replica transistor.

In the operational amplifier in accordance with the second reference example, it is necessary to set a large aspect ratio for transistors M231 and M232 constituting driver amplifier A230 in order to ensure output current IO in the load driving state. The aspect ratio of a transistor means a ratio W/L between a gate width W and a gate length L of the transistor. As the aspect ratio of the transistor increases, the size of the transistor increases. In order to bias large-sized transistors M231 and M232 to an ON state, it is necessary to pass quiescent current IQ through transistors M231 and M232 when the operational amplifier is in the quiescent state. Accordingly, in order to ensure the accuracy of control of class AB operation, that is, the accuracy of detection of drain currents IDS of transistors M231 and M232, it is required to increase the size of replica transistors M220 and M224.

However, if the size of a replica transistor is increased, the gate capacitance thereof increases, and thus there is a concern that the frequency characteristic of the operational amplifier may become worse. Accordingly, in order to ensure the frequency characteristic of the operational amplifier, it is desirable to decrease the size of the replica transistor as much as possible. In addition, in order to suppress the consumed current of the current mirror circuit, it is desirable to decrease the drain current of the replica transistor, that is, to set the mirror ratio in the current mirror circuit to be close to zero as much as possible. Thus, in the current mirror circuit, the accuracy of control of class AB operation, the frequency characteristic, and the consumed current have a trade-off with one another.

As described above, since there is a trade-off among the signal quality, the accuracy of control of class AB operation, the frequency characteristic, and the consumed current in the operational amplifier in accordance with the second reference example, it is difficult to achieve all of these.

Accordingly, the present embodiment provides a configuration of a new operational amplifier that can improve the trade-off present in the operational amplifier in accordance with the second reference example. Hereinafter, an exemplary configuration of the operational amplifier in accordance with the present embodiment will be described in detail, with reference to the drawings.

First Embodiment

FIG. 1 is a view showing a configuration of an operational amplifier in accordance with a first embodiment. In the following description, a terminal and a signal are designated by the same name. In addition, concerning the designation of voltages and currents, a voltage/current with an uppercase prefix (such as V or I) represents a large signal (direct current signal), and a voltage/current with a lowercase prefix (such as v or i) represents a small signal (alternating current signal).

Referring to FIG. 1, the operational amplifier in accordance with the first embodiment includes differential input stage A100 and output stage A200. Output stage A200 is a feedback-type class AB amplifier, and has active load stage AL210, minimum selector MS220, and driver amplifier A230.

Differential input stage A100 receives first potential VIP at non-inverting input terminal VIP, and receives second potential VIM at inverting input terminal VIM. Differential input stage A100 converts first potential VIP and second potential VIM into first input current IIM and second input current IIP.

Active load stage AL210 receives first input current IIM outputted from differential input stage A100 at first input terminal IIM, and receives second input current IIP outputted from differential input stage A100 at second input terminal IIP. Active load stage AL210 converts input currents IIP and IIM into voltage signals Vgpp and Vgpn.

In driver amplifier A230, the gate of transistor M232 receives voltage signal Vgpp, and the gate of transistor M231 receives voltage signal Vgpn. Voltage signal Vgpn corresponds to a "first voltage", and voltage signal Vgpp corresponds to a "second voltage". Each of transistors M231 and M232 outputs a current amplified according to the voltage signal applied to the gate to output terminal VO.

Minimum selector MS220 detects whether each of transistor M231 and transistor M232 constituting output stage A230 is in a load driving state or in a quiescent state. Minimum selector MS220 detects a bias state of the transistor in the quiescent state, and generates bias control voltage Vbab based on the detected bias state.

As shown in FIG. 1, the operational amplifier in accordance with the first embodiment is different from the operational amplifier in accordance with the second reference example shown in FIG. 12 in the configuration of minimum selector MS220. Since each of differential input stage A100, active load stage AL210, and driver amplifier A230 has the same configuration as that in the second reference example, the description thereof will not be repeated.

Minimum selector MS220 has a voltage comparator A221, a first transconductance amplifier A242, a second transconductance amplifier A243, and an active load AL244.

Voltage comparator A221 receives a reference voltage Vrefn0 at the inverting input terminal, and receives gate voltage Vgpn of transistor M231 at the non-inverting input terminal. Reference voltage Vrefn0 corresponds to a "third reference voltage". Voltage comparator A221 compares gate voltage Vgpn with reference voltage Vrefn0, and generates a first selection control signal SEL1 and a second selection control signal SEL2 based on a comparison result.

Specifically, in the case of gate voltage Vgpn>reference voltage Vrefn0, voltage comparator A221 sets first selection control signal SEL1 to an ON state and sets second selection control signal SEL2 to an OFF state. On the other hand, in the case of gate voltage Vgpn reference voltage Vrefn0, voltage comparator A221 sets second selection control signal SEL2 to an ON state and sets first selection control signal SEL1 to an OFF state.

First transconductance amplifier A242 receives first selection control signal SEL1. First transconductance amplifier A242 operates when first selection control signal SEL1 is in the ON state (that is, in the case of Vgpn>Vrefn0). First transconductance amplifier A242 receives gate voltage Vgpn of transistor M231 at the inverting input terminal, and receives a reference voltage Vrefn1 at the non-inverting input terminal. Reference voltage Vrefn1 corresponds to a "first reference voltage". Reference voltage Vrefn1 is set to a voltage corresponding to gate voltage Vgpn when the absolute value of drain current IDS231 of transistor M231 becomes equal to IQ. When first selection control signal SEL1 is in the ON state, first transconductance amplifier A242 converts a voltage difference between gate voltage Vgpn and reference voltage Vrefn1 into a current, and outputs the current.

Second transconductance amplifier A243 receives second selection control signal SEL2. Second transconductance amplifier A243 operates when second selection control signal SEL2 is in the ON state (that is, in the case of Vgpn Vrefn0). Second transconductance amplifier A243 receives gate voltage Vgpp of transistor M232 at the inverting input terminal, and receives a reference voltage Vrefp1 at the non-inverting input terminal. Reference voltage Vrefp1 corresponds to a "second reference voltage". Reference voltage Vrefp1 is set to a voltage corresponding to gate voltage Vgpp when the absolute value of drain current IDS232 of transistor M232 becomes equal to IQ. When second selection control signal SEL2 is in the ON state, second transconductance amplifier A243 converts a voltage difference between gate voltage Vgpp and reference voltage Vrefp1 into a current, and outputs the current.

Active load AL244 adds the output current of first transconductance amplifier A242 and the output current of second transconductance amplifier A243, and converts the added currents into bias control voltage Vbab.

In the configuration described above, in the case of gate voltage Vgpn of transistor M231>reference voltage Vrefn0, minimum selector MS200 determines that transistor M231 is in the load driving state and transistor M232 is in the quiescent state. In this case, second selection control signal SEL2 is set to the ON state. Therefore, second transconductance amplifier A243 operates upon receiving second selection control signal SEL2, and converts the voltage difference between gate voltage Vgpp of transistor M232 and reference voltage Vrefp1 into a current and outputs the current. Active load AL244 generates bias control voltage Vbab according to the output current of second transconductance amplifier A243. The generated bias control voltage Vbab is inputted to the gate of transistor M2082 of active load stage AL210.

In active load stage AL210, transistor M2081 and transistor M2082 constitute a differential pair, and transistor M2061 and transistor M2062 constitute an active load. The differential pair and the active load constitute a differential amplifier. The differential amplifier functions as a bias control amplifier for controlling bias control voltage Vbab to be generated in minimum selector MS220. Specifically, the gate of transistor M2081 receives reference voltage Vbp2. Reference voltage Vbp2 corresponds to a "fourth reference voltage". The gate of transistor M2082 receives bias control voltage Vbab. Reference voltage Vbp2 is set to a ground voltage. The bias control amplifier generates voltage signals Vgpp and Vgpn such that bias control voltage Vbab becomes equal to reference voltage Vbp2. Thereby, bias control voltage Vbab is controlled such that gate voltage Vgpp of transistor M232 becomes equal to reference voltage Vrefp1. As a result, it is possible to match the absolute value of drain current IDS232 of transistor M232 to quiescent current IQ.

In contrast, in the case of gate voltage Vgpn of transistor M231 reference voltage Vrefn0, minimum selector MS200 determines that transistor M231 is in the quiescent state and transistor M232 is in the load driving state. In this case, first selection control signal SEL1 is set to the ON state. Therefore, first transconductance amplifier A242 operates upon receiving first selection control signal SEL1, and converts the voltage difference between gate voltage Vgpn of transistor M231 and reference voltage Vrefn1 into a current and outputs the current. Active load AL244 generates bias control voltage Vbab according to the output current of first transconductance amplifier A242.

In the bias control amplifier, the gate of transistor M2081 receives reference voltage Vbp2, and the gate of transistor M2082 receives bias control voltage Vbab. The bias control amplifier generates voltage signals Vgpp and Vgpn such that bias control voltage Vbab becomes equal to reference voltage Vbp2. Thereby, bias control voltage Vbab is controlled such that gate voltage Vgpn of transistor M231 becomes equal to reference voltage Vrefn1. As a result, it is possible to match the absolute value of drain current IDS231 of transistor M231 to quiescent current IQ.

Figure 2:
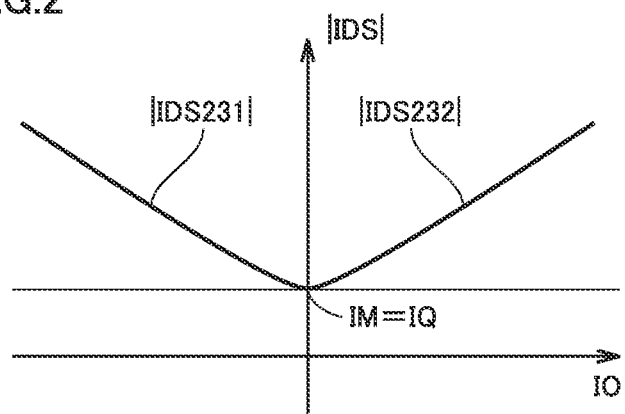
FIG. 2 is a view for describing the relation between drain currents IDS of transistors and an output current of a driver amplifier in the operational amplifier in accordance with the first embodiment.

FIG. 2 is a view for describing the relation between drain currents IDS of transistors M231 and M232 and output current IO of driver amplifier A230 in the operational amplifier in accordance with the first embodiment. FIG. 2 shows characteristic curves of the absolute value |IDS231| of the drain current of transistor M231 and the absolute value |IDS232| of the drain current of transistor M232. In FIG. 2, the axis of ordinates represents the absolute value |IDS| of each drain current, and the axis of abscissas represents output current IO from output terminal VO. Output current IO is positive in the direction in which the current flows out of output terminal VO, and is negative in the direction in which the current flows into output terminal VO.

As shown in FIG. 2, when the operational amplifier is in the quiescent state (in the case of output current IO=0), the absolute values of drain currents IDS of transistors M231 and M232 constituting driver amplifier A230 are both equal to quiescent current IQ. Further, when either one of transistor M231 and transistor M232 is in the load driving state (in the case of output current IO≠0), the absolute value |IDS| of the drain current of the other transistor which is in the quiescent state is controlled to quiescent current IQ.

Thus, the absolute values |IDS| of the drain currents of transistor M231 and transistor M232 do not become lower than quiescent current IQ. Therefore, in the first embodiment, quiescent current IQ can be set to a value smaller than the value of quiescent current IQ in the second reference example. Specifically, quiescent current IQ can be set to a value nearly equal to the value of minimum current IM in the second reference example.

Accordingly, the consumed current when the operational amplifier is in the quiescent state can be reduced. In addition, since minimum current IM in the second reference example is increased to be nearly equal to quiescent current IQ, the signal quality can be ensured. Hence, the trade-off between the consumed current and the signal quality can be improved.

Further, in the operational amplifier in accordance with the first embodiment, minimum selector MS220 does not have a current mirror circuit. Accordingly, it is not necessary to consider the trade-off between the mirror ratio and the accuracy of control of class AB operation described in the second reference example. Furthermore, deterioration of the frequency characteristic caused by the gate capacitance of a replica transistor does not occur, either. Hence, the operational amplifier in accordance with the first embodiment can improve the trade-off among the signal quality, the accuracy of control of class AB operation, the frequency characteristic, and the consumed current that is present in the operational amplifier in accordance with the second reference example.

Exemplary Configuration of Operational Amplifier in Accordance with First Embodiment Next, a specific exemplary configuration of the operational amplifier in accordance with the first embodiment will be described. The following description mainly describes an exemplary configuration of minimum selector MS220 shown in FIG. 1.

(First Exemplary Configuration of Operational Amplifier)

Figure 3:
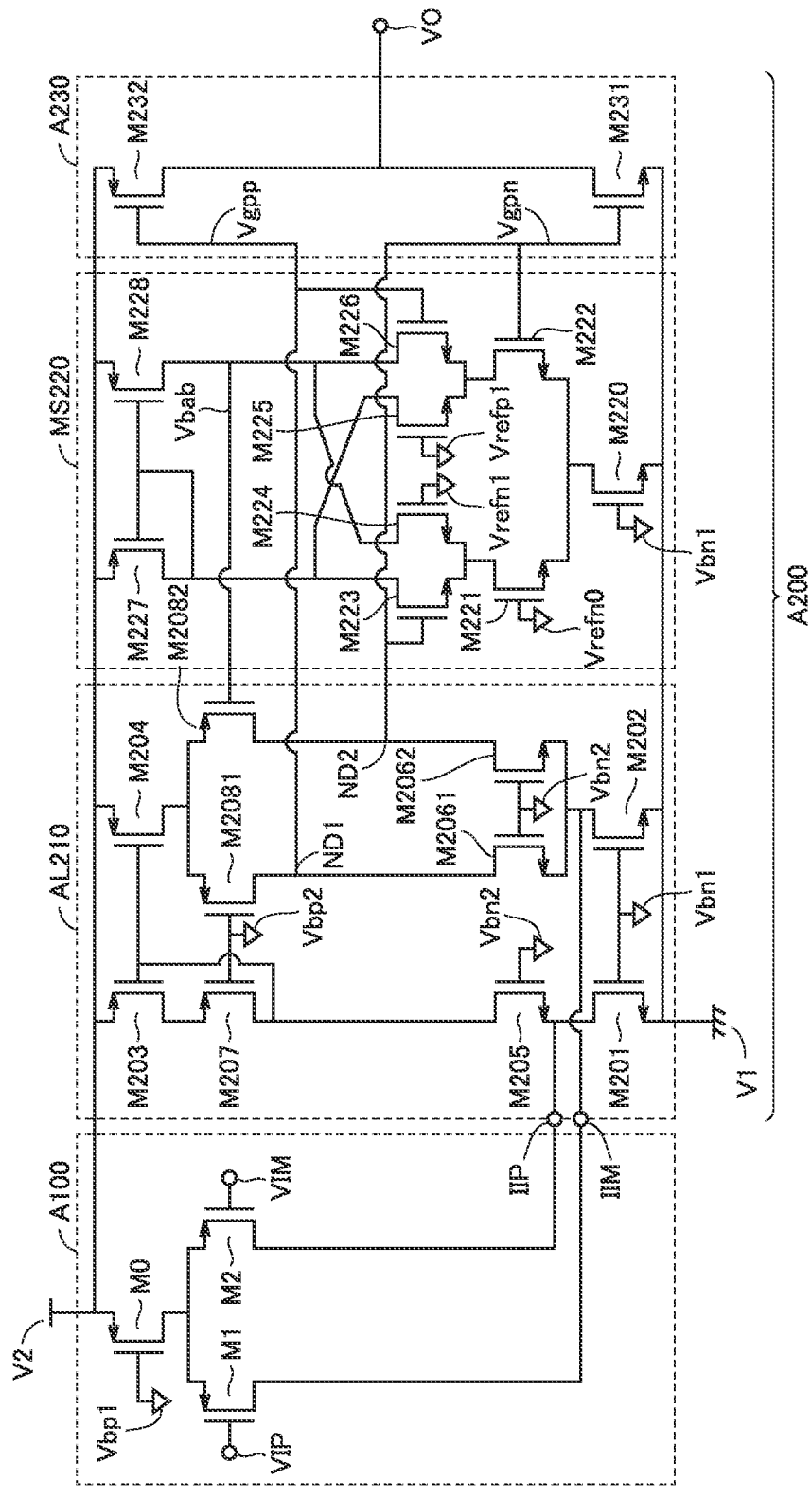
FIG. 3 is a view showing a first exemplary configuration of the operational amplifier in accordance with the first embodiment.

FIG. 3 is a view showing a first exemplary configuration of the operational amplifier in accordance with the first embodiment.

Referring to FIG. 3, in the operational amplifier in accordance with the first exemplary configuration, minimum selector MS220 has transistors M220, M221, and M222, transistors M223 and M224, transistors M225 and M226, and transistors M227 and M228. Transistors M220, M221, M222, M223, M224, M225, and M226 are N-type MOSFETs. Transistors M227 and M228 are P-type MOSFETs.

Voltage comparator A221 has transistors M220, M221, and M222. Transistor M221 and transistor M222 constitute a differential pair. Transistor M220 constitutes a constant current source. The gate of transistor M220 receives bias voltage Vbn1. The gate of transistor M222 receives gate voltage Vgpn of transistor M231. The gate of transistor M221 receives reference voltage Vrefn0.

The differential pair compares gate voltage Vgpn of transistor M231 with reference voltage Vrefn0, and distributes a bias current supplied from transistor M220 to transistor M221 and transistor M222 based on a comparison result thereof. Specifically, in the case of Vgpn<Vrefn0, transistor M221 is turned on, and supplies a bias current IDS221 from the drain thereof to first transconductance amplifier A242. On the other hand, in the case of Vgpn>Vrefn0, transistor M222 is turned on, and supplies a bias current IDS222 from the drain thereof to second transconductance amplifier A243.

Here, when a bias current supplied by transistor M220 serving as a constant current source is indicated as Ibias, bias currents IDS221 and IDS222 can be expressed by the following equations (1) and (2), respectively.

$$IDS221 = Ibias \ [Vgpn < Vrefn0] \quad (1\text{-}1)$$

$$IDS221 = Ibias/2 \ [Vgpn = Vrefn0] \quad (1\text{-}2)$$

$$IDS221 = 0 \ [Vgpn > Vrefn0] \quad (1\text{-}3)$$

$$IDS222 = 0 \ [Vgpn < Vrefn0] \quad (2\text{-}1)$$

$$IDS222 = Ibias/2 \ [Vgpn = Vrefn0] \quad (2\text{-}2)$$

$$IDS222 = Ibias \ [Vgpn > Vrefn0] \quad (2\text{-}3)$$

First transconductance amplifier A242 has transistors M223 and M224. Transistor M223 and transistor M224 constitute a differential pair. The gate of transistor M223 receives gate voltage Vgpn of transistor M231. The gate of transistor M224 receives reference voltage Vrefn1.

The differential pair of first transconductance amplifier A242 is biased by transistor M221. The differential pair operates when bias current IDS221 is supplied from transistor M221, and amplifies a potential difference between gate voltage Vgpn of transistor M231 and reference voltage Vrefn1. Transistor M223 outputs a bias control current ids223 expressed by the following equation (3). Transistor M224 outputs a bias control current ids224 expressed by the following equation (4).

$$ids223 = gm11 \cdot vgpn \quad (3)$$

$$ids224 = -gm11 \cdot vgpn \quad (4)$$

Here, gm11 is a transconductance (current gain) of first transconductance amplifier A242. In the case of IDS221=0, gm11=0 holds, and otherwise, gm11 is determined according to the value of bias current IDS221. In addition, vgpn is a small signal component of transistor M231, and is expressed by vgpn=Vgpn−Vrefn1.

Similarly, second transconductance amplifier A243 has transistors M225 and M226. Transistor M225 and transistor M226 constitute a differential pair. The gate of transistor M225 receives reference voltage Vrefp1. The gate of transistor M226 receives gate voltage Vgpp of transistor M232.

The differential pair of second transconductance amplifier A243 is biased by transistor M222. The differential pair operates when bias current IDS222 is supplied from transistor M222, and amplifies a potential difference between gate voltage Vgpp of transistor M232 and reference voltage Vrefp1. Transistor M225 outputs a bias control current ids225 expressed by the following equation (5). Transistor M226 outputs a bias control current ids226 expressed by the following equation (6).

$$ids225 = gm12 \cdot vgpp \quad (5)$$

$$ids226 = -gm12 \cdot vgpp \quad (6)$$

Here, gm12 is a transconductance (current gain) of second transconductance amplifier A243. In the case of IDS222=0, gm12=0 holds, and otherwise, gm12 is determined according to the value of bias current IDS222. In addition, vgpp is a small signal component of transistor M232, and is expressed by vgpp=Vgpp−Vrefp1.

Bias control currents ids223, ids224, ids225, and ids226 expressed by equations (3), (4), (5), and (6), respectively, are supplied to active load AL244. Active load AL244 has transistors M227 and M228. Transistor M227 and transistor M228 constitute a current mirror circuit. Active load AL244 generates bias control voltage Vbab based on the bias control currents, according to the following equations (7), (8), and (9).

$$vbab = ims \cdot rms \tag{7}$$

$$ims = (ids223 + ids225) - (ids224 + ids226) \tag{8}$$

$$= 2 \cdot (gm11 \cdot vgpn + gm12 \cdot vgpp)$$

$$rms = rds228 \, // \, rds224 \, // \, rds226 \tag{9}$$

Here, rds228 is a resistance between the drain and the source of transistor M228, rds224 is a resistance between the drain and the source of transistor M224, and rds226 is a resistance between the drain and the source of transistor M226. The symbol "//" in equation (9) means parallel connection.

Bias control voltage Vbab generated by active load AL244 is inputted to the gate of transistor M2082 of the bias control amplifier of active load stage AL210. The gate of transistor M2081 receives reference voltage Vbp2. Reference voltage Vbp2 is the ground voltage. Transistor M2081 and transistor M2082 constitute the differential pair of the bias control amplifier. Transistor M2081 outputs a drain current ids2081 expressed by the following equation (10). Transistor M2082 outputs a drain current ids2082 expressed by the following equation (11).

$$ids2081 = gm2 \cdot vbab/2 \tag{10}$$

$$ids2082 = -gm2 \cdot vbab/2 \tag{11}$$

Here, gm2 is a transconductance (current gain) of the differential pair constituted by transistors M2081 and M2082. gm2 is determined according to the value of a current IDS204 supplied to the differential pair by transistor M204. In addition, vbab shown in equation (7) is expressed by the following equation (12) using a large signal component Vbab of a bias control signal and reference voltage Vbp2.

$$vbab = Vbab - Vbp2 \tag{12}$$

Drain current ids2081 and drain current ids2082 outputted from the differential pair of the bias control amplifier are supplied to the active load of the bias control amplifier. The active load is constituted by transistors M2061 and M2062. The active load converts drain currents ids2081 and ids2082 into gate voltages vgpn_o and vgpp_o of transistors M231 and M232 of driver amplifier A230. Gate voltages vgpn_o and vgpp_o are provided by the following equations (13) and (14).

$$vgpn\_o = ids2082 \cdot rbc \tag{13}$$

$$= -gm2 \cdot vbad \cdot rbc/2$$

$$= -gm2 \cdot (gm11 \cdot vgpn + gm12 \cdot vgpp) \cdot rms \cdot rbc$$

$$vgpp\_o = ids2081 \cdot rbc \tag{14}$$

$$= gm2 \cdot vbab \cdot rbc/2$$

$$= gm2 \cdot (gm11 \cdot vgpn + gm12 \cdot vgpp) \cdot rms \cdot rbc$$

Next, drain currents IDS231 and IDS232 of driver amplifier A230 in the operational amplifier in accordance with the first embodiment will be described using equations (13) and (14) described above.

<In Case where Operational Amplifier is in Quiescent State>

First, drain currents IDS in a case where the operational amplifier is in the quiescent state will be considered.

It is assumed that, in minimum selector MS220, transistor M221 and transistor M222 constituting voltage comparator A221 are both in the ON state, and gm11 is substantially equal to gm12. When the value of gm11 and gm12 is indicated by gm1, gm11 and gm12 are expressed by the following equation (15).

$$gm11 \approx gm12 = gm1 \tag{15}$$

Using equation (15), equations (13) and (14) can be rewritten as equations (16) and (17), respectively.

$$vgpn\_o = -gm1 \cdot gm2 \cdot (vgpn + vgpp) \cdot rms \cdot rbc \tag{16}$$

$$vgpp\_o = gm1 \cdot gm2 \cdot (vgpn + vgpp) \cdot rms \cdot rbc \tag{17}$$

Further, when it is assumed that [gm1·gm2·rms·rbc] is large enough and can be considered as infinite, the following equation (18) should be satisfied to allow vgpn_o and vgpp_o to have finite values.

$$vgpn = vgpp = 0 \tag{18}$$

That is, on this occasion, gate voltages Vgpn and Vgpp become equal to reference voltages Vrefn1 and Vrefp1, respectively, as expressed by the following equations (19) and (20).

$$Vgpn = Vrefn1 \tag{19}$$

$$Vgpp = Vrefp1 \tag{20}$$

Here, when it is assumed that drain current IDS231 of transistor M231 in a case where gate voltage Vgpn is equal to reference voltage Vrefn1 and drain current IDS232 of transistor M232 in a case where gate voltage Vgpp is equal to reference voltage Vrefp1 are both equal to IQ, drain currents IDS231 and IDS232 are provided by the following equation (21).

$$IDS231 = IDS232 = IQ \tag{21}$$

In this manner, in the case where the operational amplifier is in the quiescent state, drain current IDS231 (quiescent current) of transistor M231 and drain current IDS232 (quiescent current) of transistor M232 are both controlled to IQ in driver amplifier A230.

<In Case where Transistor M231 is in Load Driving State>

Next, drain currents IDS in a case where the operational amplifier is driving a load in the direction in which the current is drawn into output terminal VO will be considered. That is, the case is where transistor M231 is in the load driving state and transistor M232 is in the quiescent state, and output current IO<0 holds.

Since gate voltage Vgpn of transistor M231 is larger than reference voltage Vrefn0, transistor M221 is turned off and transistor M222 is turned on in voltage comparator A221. When it is assumed that gm11=0 and gm12=gm1 (however, gm1≠0), equation (13) and equation (14) are replaced by the following equation (22) and equation (23), respectively.

$$vgpn\_o = -gm1 \cdot gm2 \cdot vgpp \cdot rms \cdot rbc \quad (22)$$

$$vgpp\_o = gm1 \cdot gm2 \cdot vgpp \cdot rms \cdot rbc \quad (23)$$

Further, when it is assumed that [gm1·gm2·rms·rbc] is large enough and can be considered as infinite, the following equation (24) should be satisfied to allow vgpn_o and vgpp_o to have finite values.

$$vgpp = 0 \quad (24)$$

That is, on this occasion, gate voltage Vgpp becomes equal to reference voltage Vrefp1, as expressed by the following equation (25).

$$Vgpp = Vrefp1 \quad (25)$$

Here, when it is assumed that drain current IDS232 of transistor M232 in the case where gate voltage Vgpp is equal to reference voltage Vrefp1 is equal to IQ, drain current IDS232 is provided by the following equation (26).

$$IDS232 = IQ \quad (26)$$

In this manner, in the case where transistor M231 is in the load driving state, drain current IDS232 (quiescent current) of transistor M232 is controlled to IQ.

<In Case where Transistor M232 is in Load Driving State>

Next, drain currents IDS in a case where the operational amplifier is driving the load in the direction in which the current is outputted from output terminal VO will be considered. That is, the case is where transistor M231 is in the quiescent state and transistor M232 is in the load driving state, and output current IO>0 holds.

Since gate voltage Vgpp of transistor M232 is smaller than reference voltage Vrefn0, transistor M221 is turned on and transistor M222 is turned off in voltage comparator A221. When it is assumed that gm11=gm1 (however, gm1≠0) and gm12=0, the following equation (27) and equation (28) are derived from the same consideration as that in the above case where transistor M231 is in the load driving state.

$$vgpn = 0 \quad (27)$$

$$Vgpn = Vrefn1 \quad (28)$$

Here, when it is assumed that drain current IDS231 of transistor M231 in the case where gate voltage Vgpn is equal to reference voltage Vrefn1 is equal to IQ, drain current IDS231 is provided by the following equation (29).

$$IDS231 = IQ \quad (29)$$

In this manner, in the case where transistor M232 is in the load driving state, drain current IDS231 (quiescent current) of transistor M231 is controlled to IQ.

As described above, according to the operational amplifier in accordance with the first embodiment, irrespective of the load driving state of driver amplifier A230, the absolute values of drain currents IDS of transistor M231 and transistor M232 can both be controlled to a value that is more than or equal to quiescent current IQ.

Further, all the transistors constituting voltage comparator A221, transconductance amplifiers A242 and A243, and active load AL244 in minimum selector MS220 can have a size smaller than that of the transistors constituting the current mirror circuit.

Furthermore, the bias currents in minimum selector MS220 can be set regardless of the size and the quiescent current of the transistors constituting drive amplifier A230. Accordingly, an excellent class AB operation, a low consumed current, and an excellent frequency characteristic can be achieved while suppressing a parasitic capacitance.

It should be noted that, in the first exemplary configuration, absolute values of threshold voltages of transistors M223, M224, M225, and M226 can be set to be smaller than absolute values of threshold voltages of transistors M220, M221, and M222. Since this increases the operation voltage range of minimum selector MS220, the signal quality and the frequency characteristic can be improved.

(Second Exemplary Configuration of Operational Amplifier)

Figure 4:
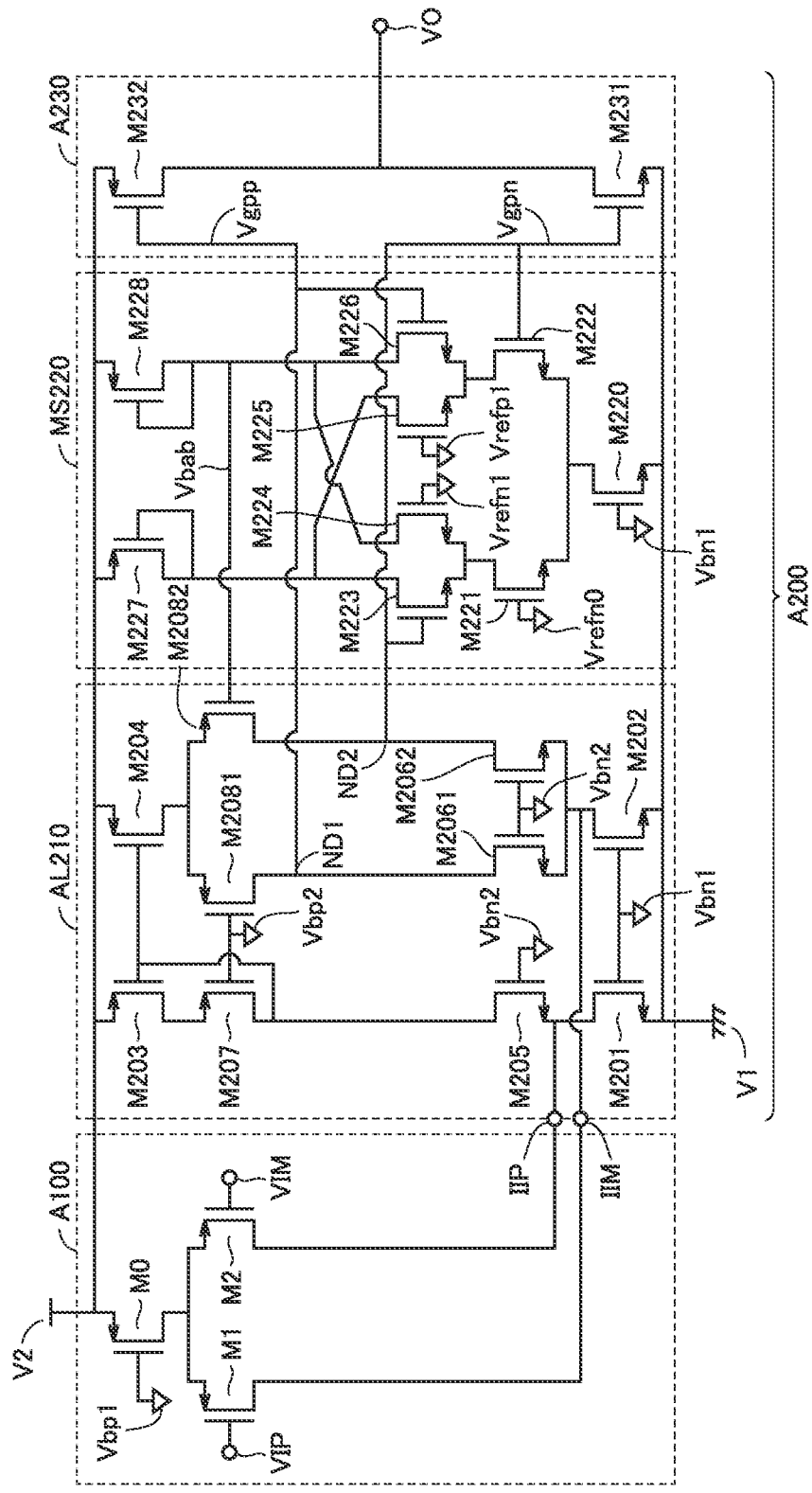
FIG. 4 is a view showing a second exemplary configuration of the operational amplifier in accordance with the first embodiment.

FIG. 4 is a view showing a second exemplary configuration of the operational amplifier in accordance with the first embodiment.

Referring to FIG. 4, the operational amplifier in accordance with the second exemplary configuration is different from the operational amplifier in accordance with the first exemplary configuration shown in FIG. 3 in the configuration of minimum selector MS220.

Specifically, minimum selector MS220 in accordance with the second exemplary configuration is different from minimum selector MS220 in accordance with the first exemplary configuration in the configuration of active load AL244. As shown in FIG. 4, each of transistor M227 and transistor M228 constituting active load AL244 is in so-called diode connection in which the gate and the drain thereof are connected. Since this reduces the voltage gain of minimum selector MS220, the accuracy of control of class AB operation is reduced, but the frequency characteristic of minimum selector MS220 can be improved.

Other Exemplary Configurations of Operational Amplifier in Accordance with First Embodiment (1) In the first exemplary configuration and the second exemplary configuration described above, reference voltage Vrefn0 (the third reference voltage) of voltage comparator A221 and reference voltage Vrefn1 (the first reference voltage) of first transconductance amplifier A242 are set as separate voltages. However, they may be set as the same voltage.

(2) Bias control voltage Vbab supplied from minimum selector MS220 to active load stage AL210 may be supplied via an amplifier.

(3) The description has been given of the configuration in which the load driving state of driver amplifier A230 is detected by comparing gate voltage Vgpn (the first voltage) of transistor M231 of driver amplifier A230 with reference voltage Vrefn0 (the third reference voltage) in voltage comparator A221. However, the load driving state of driver amplifier A230 may be detected based on gate voltage Vgpp (the second voltage) of transistor M232.

(4) In minimum selector MS220 shown in FIG. 4, instead of the drain voltage of transistor M228 of minimum selector MS220, the gate potential of transistor M2081 of the bias control amplifier of active load stage AL210 may be supplied as the drain voltage of transistor M227.

(5) By using MOSFETs with a low threshold value or so-called native transistors with a threshold value of zero as the transistors constituting the differential pair in each of voltage comparator A221, first transconductance amplifier A242, and second transconductance amplifier A243, an operational amplifier applicable to an application with a low power supply voltage can be provided.

Figure 5:
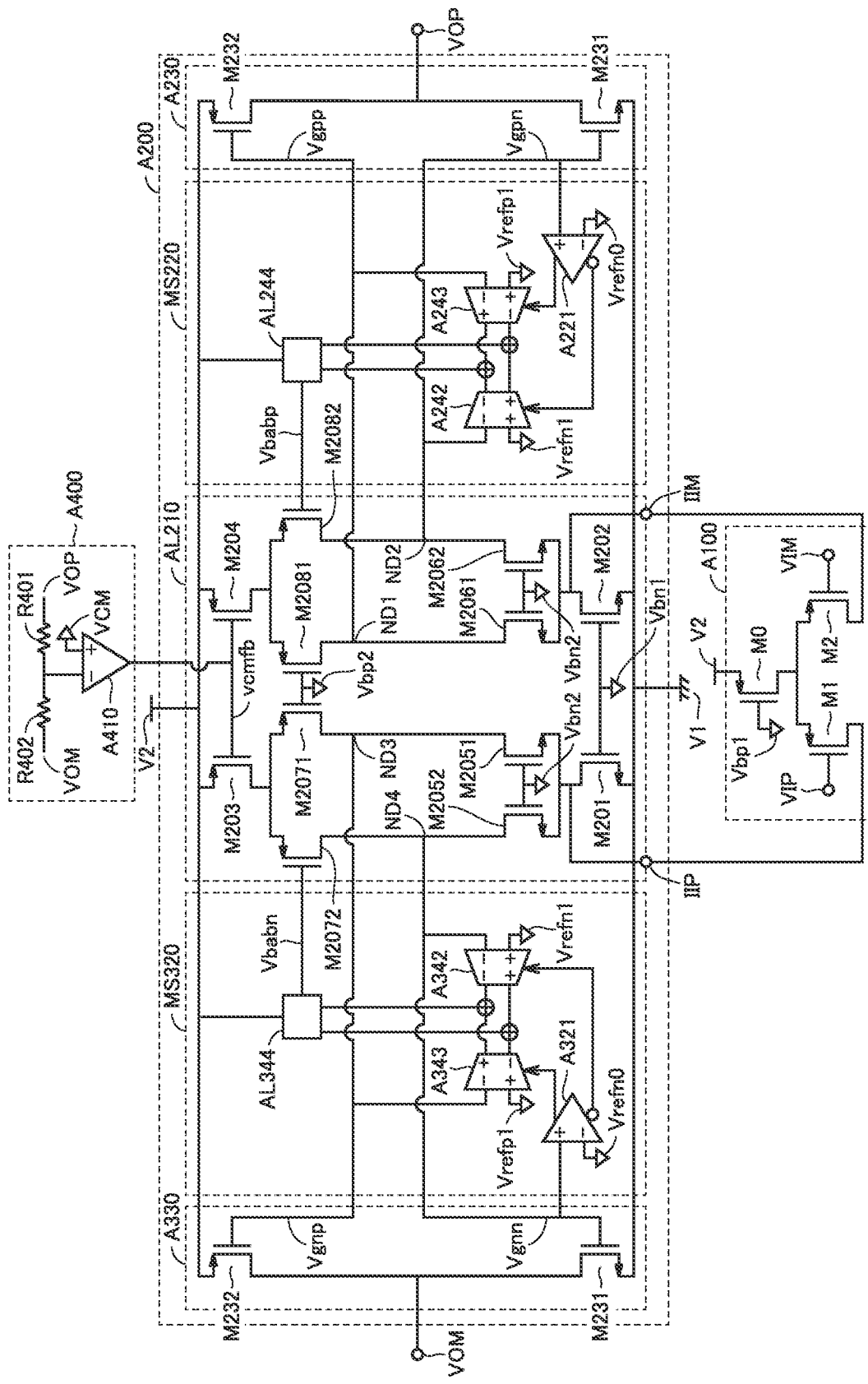
FIG. 5 is a view showing a configuration of an operational amplifier in accordance with a variation of the first embodiment.
Figure 6:
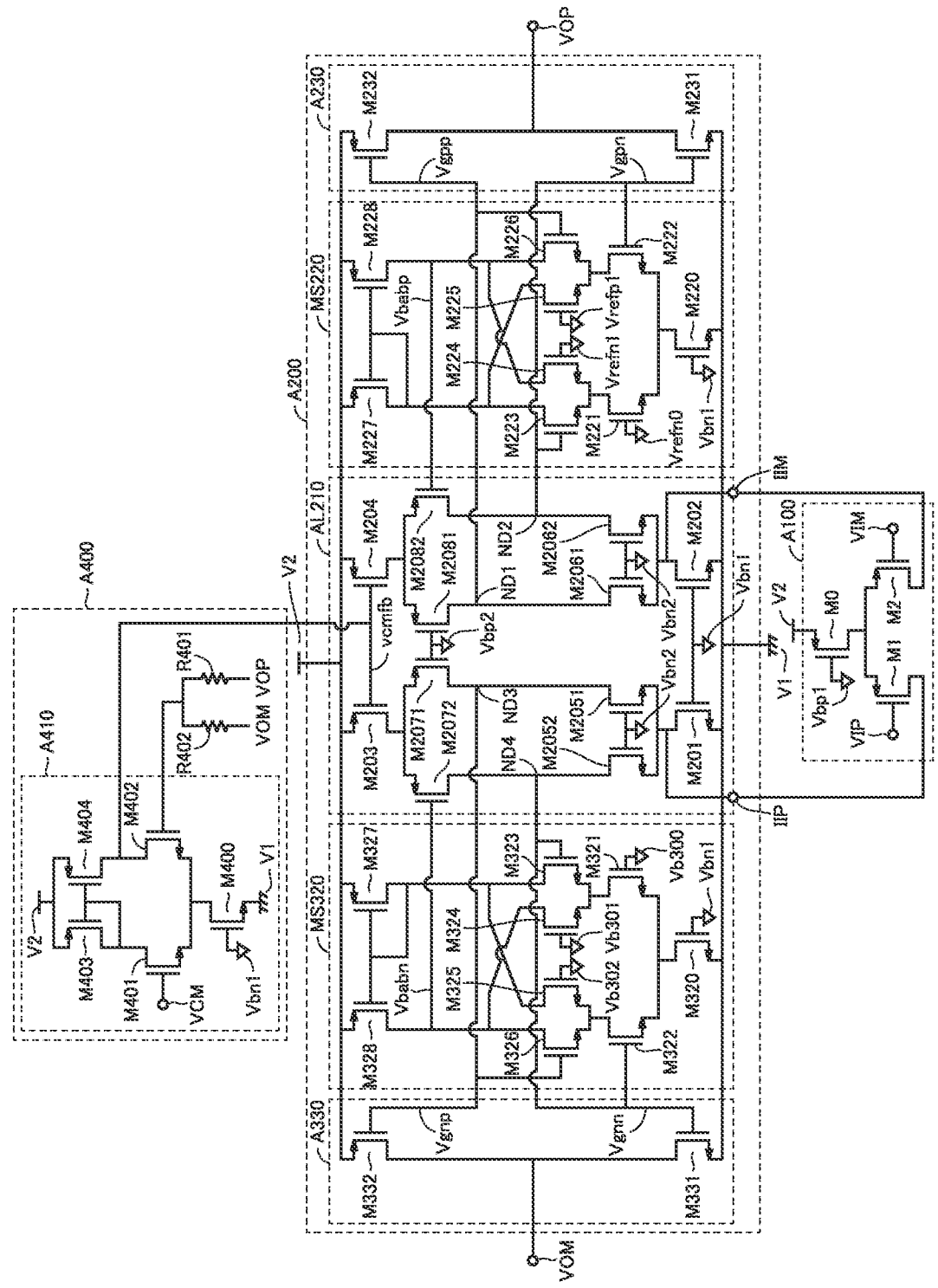
FIG. 6 is a view showing an exemplary configuration of the operational amplifier shown in FIG. 5.

(6) The operational amplifier in accordance with the first embodiment is also applicable to a full differential operational amplifier as shown in FIGS. 5 and 6. FIG. 5 is a view showing a configuration of an operational amplifier in accordance with a variation of the first embodiment. FIG. 6 is a view showing an exemplary configuration of the operational amplifier shown in FIG. 5.

Referring to FIGS. 5 and 6, the operational amplifier in accordance with the variation of the first embodiment includes differential input stage A100, output stage A200, and a common-mode feedback circuit A400. When compared with output stage A200 in accordance with the first embodiment, output stage A200 in accordance with the present variation further includes a minimum selector MS320 and a driver amplifier A330.

Minimum selector MS320 has the same configuration as that of minimum selector MS220. Minimum selector MS320 has a voltage comparator A321, a first transconductance amplifier A342, a second transconductance amplifier A343, and an active load AL344. Minimum selector MS220 corresponds to one embodiment of a "first minimum selector", and minimum selector MS320 corresponds to one embodiment of a "second minimum selector".

Driver amplifier A330 has the same configuration as that of driver amplifier A230. Driver amplifier A230 outputs a first output current to a first output terminal VOP. Driver amplifier A330 outputs a second output current to a second output terminal VOM. Driver amplifier A230 corresponds to one embodiment of a "first driver amplifier", and driver amplifier A330 corresponds to one embodiment of a "second driver amplifier". In driver amplifier A230, transistor M231 corresponds to a "first transistor", and transistor M232 corresponds to a "second transistor". In driver amplifier A330, transistor M231 corresponds to a "third transistor", and transistor M232 corresponds to a "fourth transistor".

Active load stage AL210 has a first bias control amplifier for controlling a bias control voltage Vbabp to be supplied from minimum selector MS220, and a second bias control amplifier for controlling a bias control voltage Vbabn to be supplied from minimum selector MS320.

The second bias control amplifier has the same configuration as that of the first bias control amplifier. Specifically, in the second bias control amplifier, transistor M207 in the first embodiment is divided into a transistor M2071 and a transistor M2072, and transistor M205 in the first embodiment is divided into a transistor M2051 and a transistor M2052. A node ND3, which is the connection point between the drain of transistor M2071 and the drain of transistor M2051, is connected to the gate of transistor M232. A node ND4, which is the connection point between the drain of transistor M2072 and the drain of transistor M2052, is connected to the gate of transistor M231. Transistor M2071 and transistor M2072 constitute a differential pair, and transistor M2051 and transistor M2052 constitute an active load. The differential pair and the active load constitute a differential amplifier. The differential amplifier functions as a bias control amplifier for controlling bias control voltage Vbabn to be generated in minimum selector MS320.

Common-mode feedback circuit A400 has resistors R401 and R402 and an amplifier A410. Resistor R401 and resistor R402 are connected in series between output terminal VOP and output terminal VOM. The connection point between resistor R401 and resistor R402 is connected to the inverting input terminal of amplifier A410. The inverting input terminal of amplifier A410 receives a voltage that is intermediate between a voltage VOP of output terminal VOP and a voltage VOM of output terminal VOM. The non-inverting input terminal of amplifier A410 receives a reference voltage VCM. Amplifier A410 amplifies a potential difference between reference voltage VCM and the intermediate voltage between voltage VOM and voltage VOP, and outputs the amplified potential difference. An output voltage vcmfb of amplifier A410 is inputted to the gates of transistor M204 and transistor M203 of active load stage AL210. Common-mode feedback circuit A400 controls active load stage AL210 such that the intermediate voltage becomes equal to reference voltage VCM.

Also in the operational amplifier in accordance with the present variation, irrespective of the load driving state of driver amplifier A230, drain currents IDS of transistor M231 and transistor M232 can both be controlled to have a value that is more than or equal to quiescent current IQ, and irrespective of the load driving state of driver amplifier A330, drain currents IDS of transistor M231 and transistor M232 can both be controlled to have a value that is more than or equal to quiescent current IQ, as in the operational amplifier in accordance with the first embodiment.

(7) The configuration of the operational amplifier in accordance with the first embodiment is not limited to the exemplary configurations shown in FIGS. 1 to 6, and each differential pair can have a rail-to-rail configuration, or polarity can be manipulated. Further, N-type MOSFETs and P-type MOSFETs can be exchanged, and a positive power source and a negative power source can be exchanged. Furthermore, transistors can have a cascode configuration, or a transistor can be divided or transistors can be integrated. Moreover, other configurations are applicable as the common-mode feedback circuit. In any of these configurations, the same function and effect as those of the operational amplifier in accordance with the first embodiment can be obtained.

Second Embodiment

Figure 7:
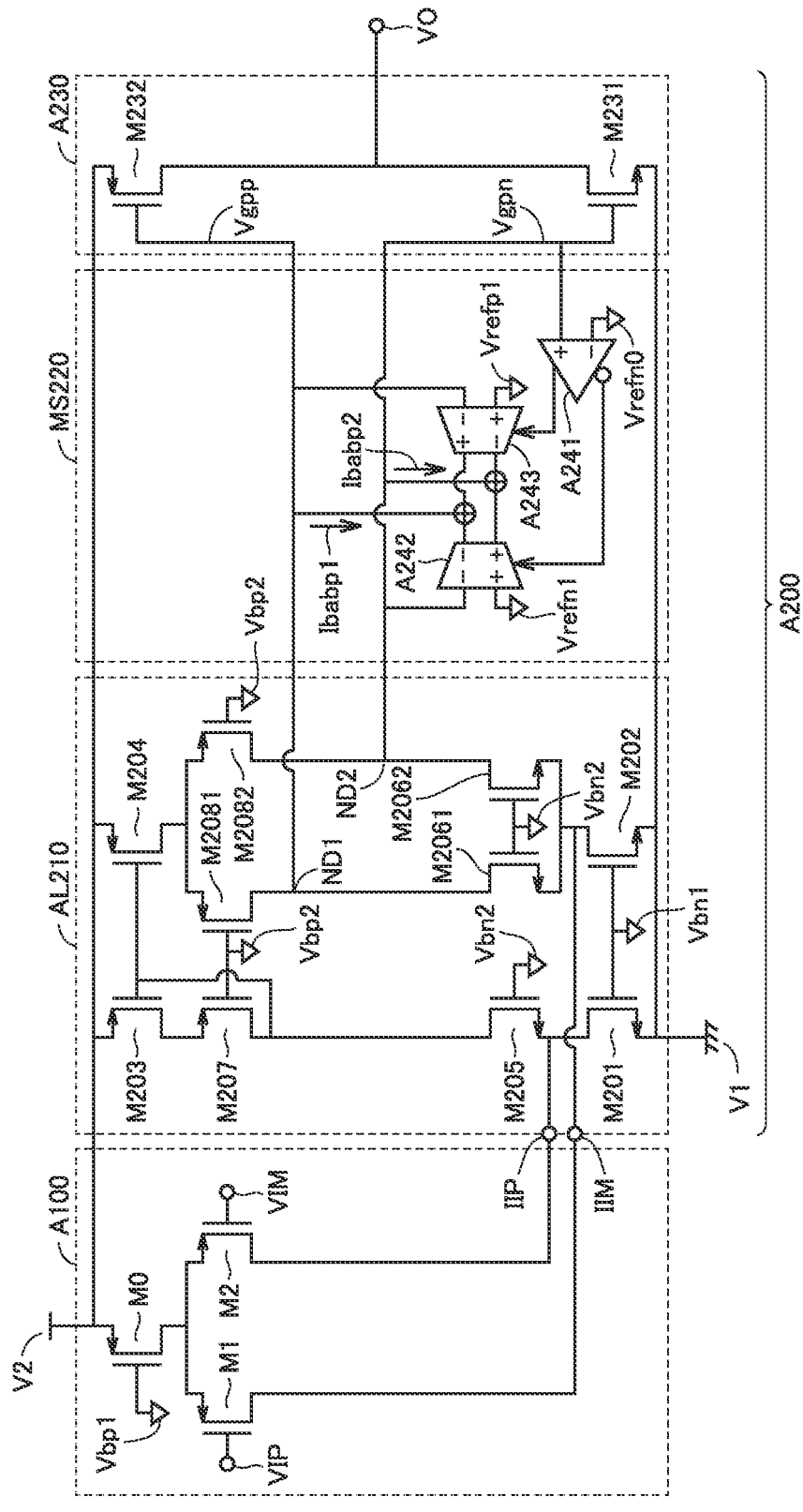
FIG. 7 is a view showing a configuration of an operational amplifier in accordance with a second embodiment.
Figure 8:
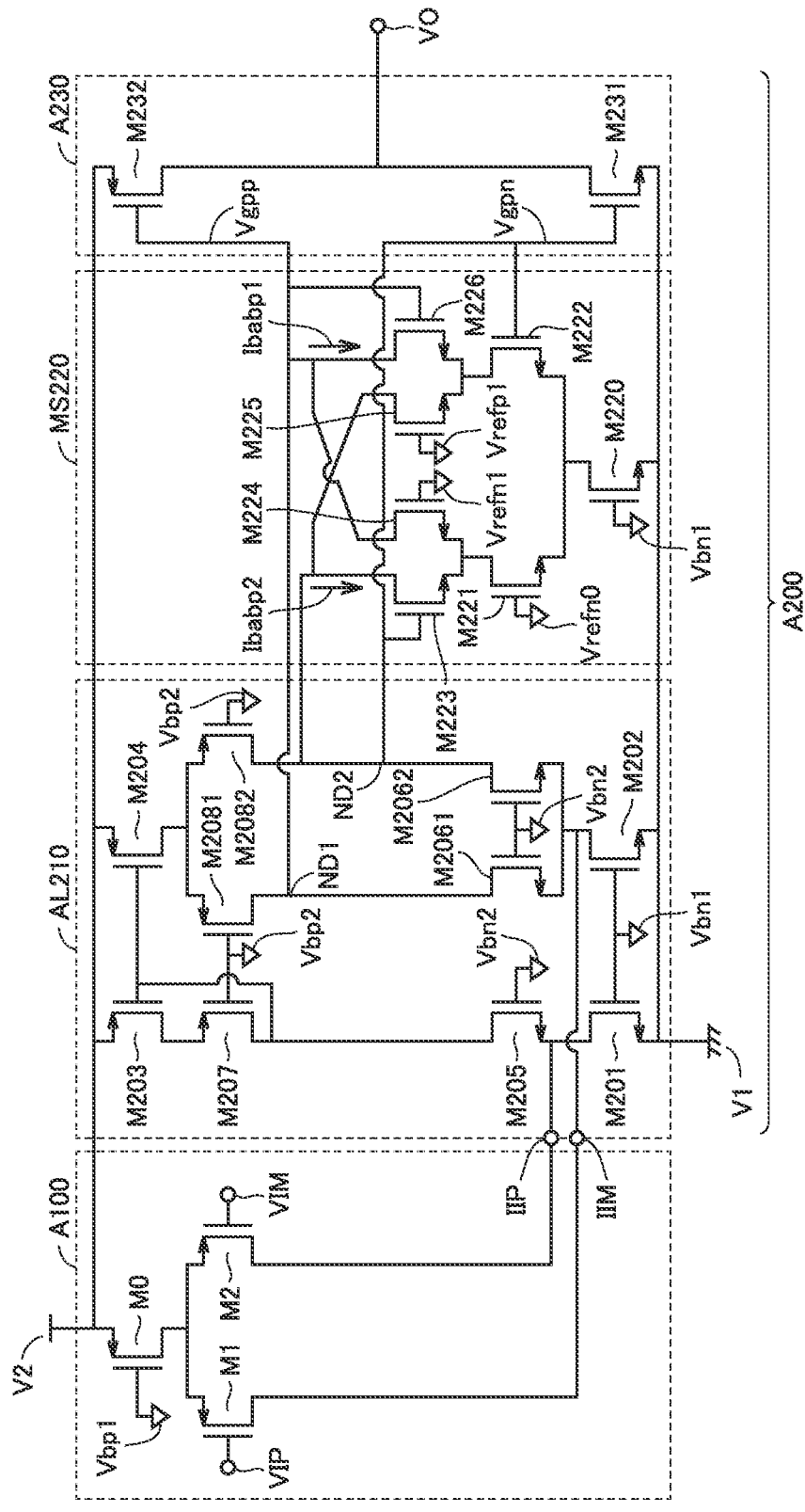
FIG. 8 is a view showing an exemplary configuration of the operational amplifier shown in FIG. 7.

FIG. 7 is a view showing a configuration of an operational amplifier in accordance with a second embodiment. FIG. 8 is a view showing an exemplary configuration of the operational amplifier shown in FIG. 7.

Referring to FIG. 7, the operational amplifier in accordance with the second embodiment is different from the operational amplifier in accordance with the first embodiment shown in FIG. 1 in the configuration of minimum selector MS220. When compared with minimum selector MS220 in the first embodiment, minimum selector MS220 in the second embodiment does not include active load AL244.

In minimum selector MS220 in the second embodiment, an output terminal of first transconductance amplifier A242 is connected to the drain of transistor M2081, which is an output portion of the bias control amplifier of active load stage AL210, and to the gate of transistor M232 of driver amplifier A230. An output terminal of second transconductance amplifier A243 is connected to the drain of transistor M2082, which is an output portion of the bias control amplifier of active load stage AL210, and to the gate of transistor M231 of driver amplifier A230. The gates of transistor M2081 and transistor M2082 constituting the differential pair receives reference voltage Vbp2.

A current Ibabp1 obtained by adding an output current of first transconductance amplifier A242 and an output current of second transconductance amplifier A243 is inputted to the gate of transistor M232. A current Ibabp2 obtained by adding an output current of first transconductance amplifier A242 and an output current of second transconductance amplifier A243 is inputted to the gate of transistor M231.

According to the operational amplifier in accordance with the second embodiment, minimum selector MS220 can be constituted by transistors of a single conductivity type (N-type MOSFETs in FIG. 8). Therefore, an operational amplifier that achieves the same function and effect as those in the first embodiment can be achieved more easily and with a smaller area when compared with the operational amplifier in accordance with the first embodiment.

Figure 9:
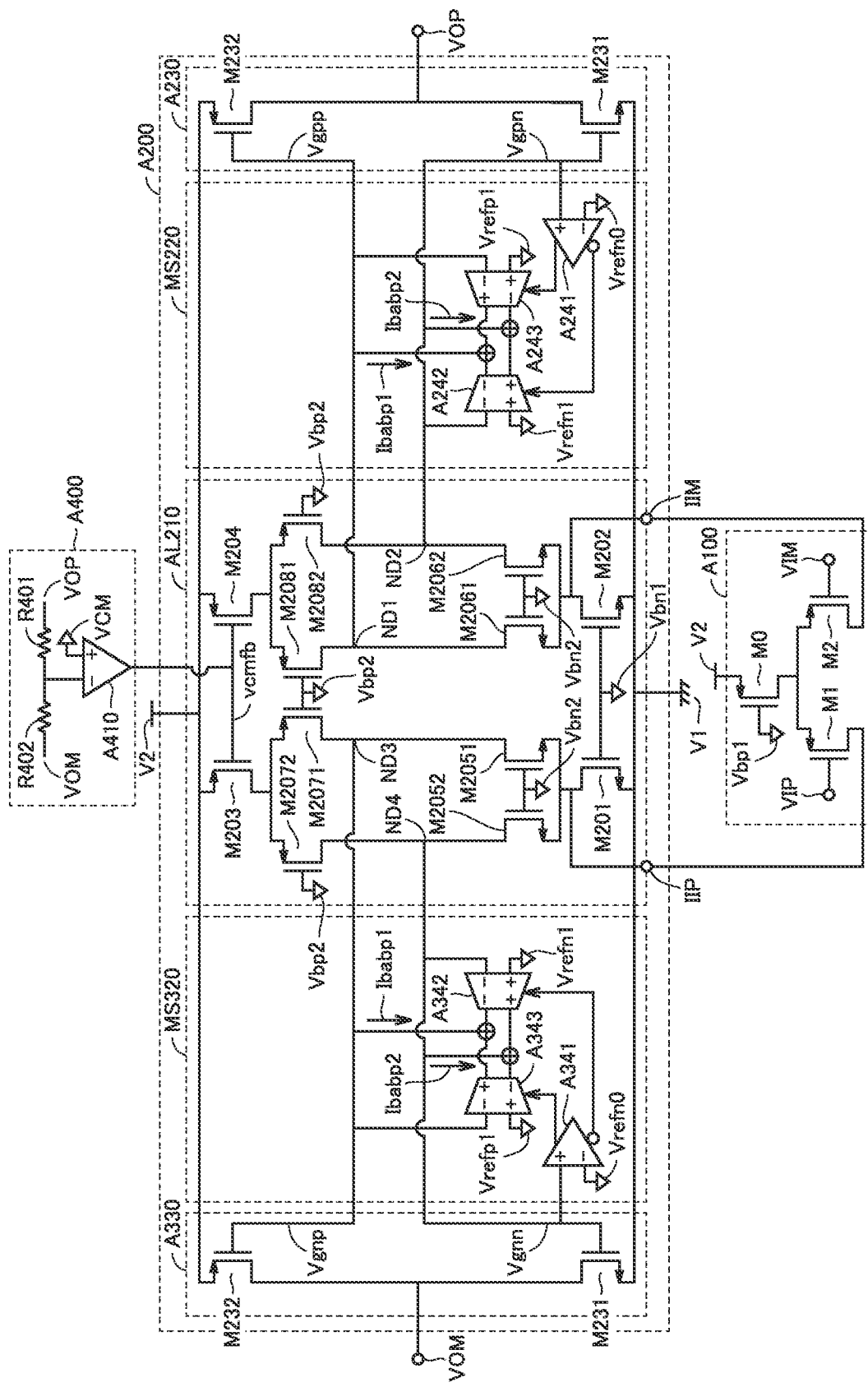
FIG. 9 is a view showing a configuration of an operational amplifier in accordance with a variation of the second embodiment.
Figure 10:
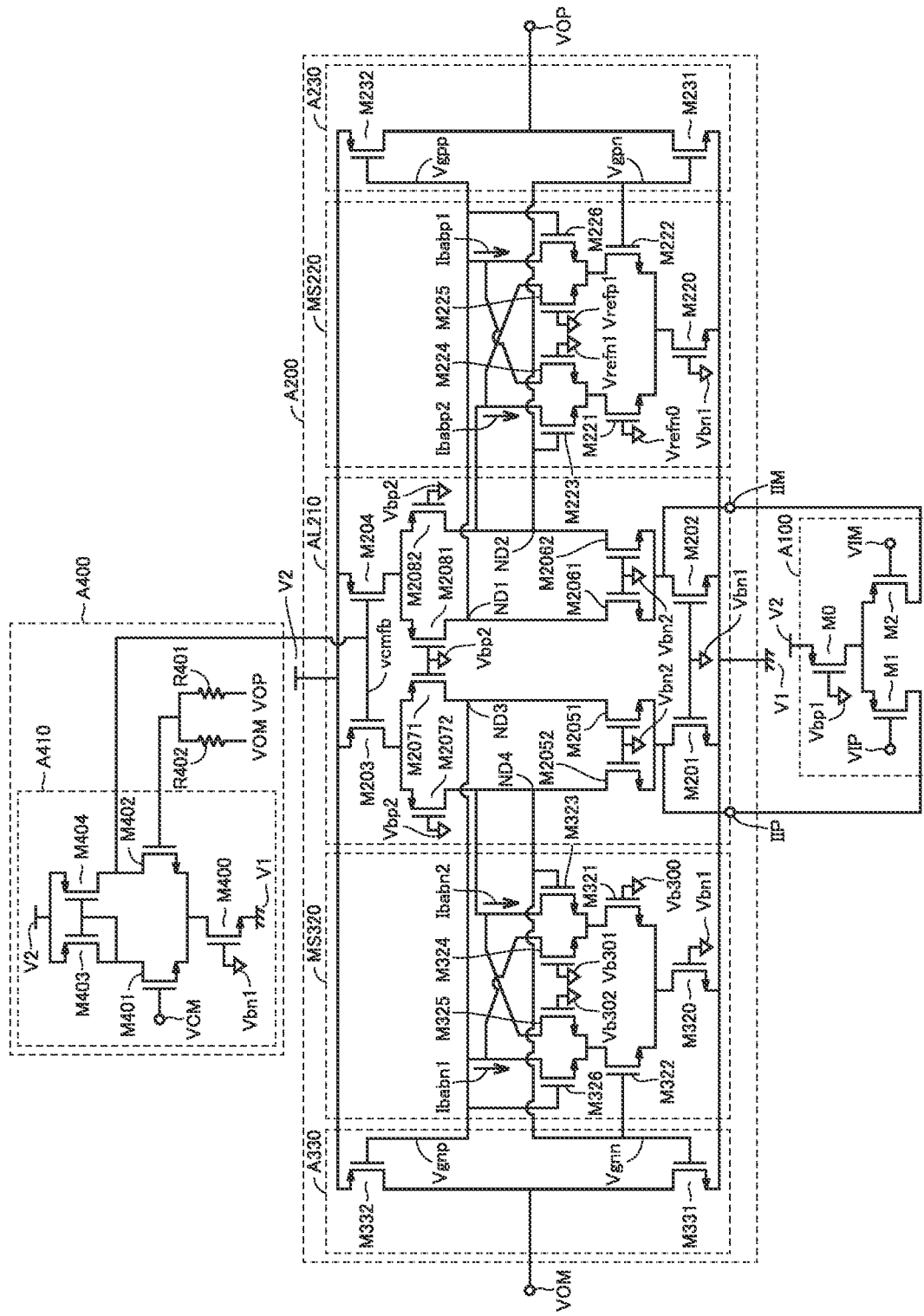
FIG. 10 is a view showing an exemplary configuration of the operational amplifier shown in FIG. 9.

It should be noted that the operational amplifier in accordance with the second embodiment is also applicable to a full differential operational amplifier as shown in FIGS. 9 and 10. FIG. 9 is a view showing a configuration of an operational amplifier in accordance with a variation of the second embodiment. FIG. 10 is a view showing an exemplary configuration of the operational amplifier shown in FIG. 9.

Referring to FIGS. 9 and 10, the operational amplifier in accordance with the variation of the second embodiment includes differential input stage A100, output stage A200, and common-mode feedback circuit A400. When compared with output stage A200 in accordance with the second embodiment, output stage A200 in accordance with the present variation further includes minimum selector MS320 and driver amplifier A330.

Minimum selector MS320 has the same configuration as that of minimum selector MS220. Minimum selector MS320 has voltage comparator A321, first transconductance amplifier A342, second transconductance amplifier A343, and active load AL344. Minimum selector MS220 corresponds to one embodiment of a "first minimum selector", and minimum selector MS320 corresponds to one embodiment of a "second minimum selector".

In minimum selector MS220, current Ibabp1 obtained by adding an output current of first transconductance amplifier A242 and an output current of second transconductance amplifier A243 is inputted to the gate of transistor M232. Current Ibabp2 obtained by adding an output current of first transconductance amplifier A242 and an output current of second transconductance amplifier A243 is inputted to the gate of transistor M231.

In minimum selector MS320, current Ibabp1 obtained by adding an output current of first transconductance amplifier A342 and an output current of second transconductance amplifier A343 is inputted to the gate of transistor M232. Current Ibabp2 obtained by adding an output current of first transconductance amplifier A342 and an output current of second transconductance amplifier A343 is inputted to the gate of transistor M231.

Driver amplifier A330 has the same configuration as that of driver amplifier A230. Driver amplifier A230 outputs a first output current to first output terminal VOP. Driver amplifier A330 outputs a second output current to second output terminal VOM. Driver amplifier A230 corresponds to one embodiment of a "first driver amplifier", and driver amplifier A330 corresponds to one embodiment of a "second driver amplifier". In driver amplifier A230, transistor M231 corresponds to a "first transistor", and transistor M232 corresponds to a "second transistor". In driver amplifier A330, transistor M231 corresponds to a "third transistor", and transistor M232 corresponds to a "fourth transistor".

In the present variation, in active load stage AL210, transistor M207 in the second embodiment is divided into transistor M2071 and transistor M2072, and transistor M205 in the second embodiment is divided into transistor M2051 and transistor M2052. Node ND3, which is the connection point between the drain of transistor M2071 and the drain of transistor M2051, is connected to the gate of transistor M232. Node ND4, which is the connection point between the drain of transistor M2072 and the drain of transistor M2052, is connected to the gate of transistor M231. Transistor M2071 and transistor M2072 constitute a differential pair, and transistor M2051 and transistor M2052 constitute an active load. The differential pair and the active load constitute a differential amplifier.

Common-mode feedback circuit A400 has resistors R401 and R402 and amplifier A410. Resistor R401 and resistor R402 are connected in series between output terminal VOP and output terminal VOM. The connection point between resistor R401 and resistor R402 is connected to the inverting input terminal of amplifier A410. The inverting input terminal of amplifier A410 receives a voltage that is intermediate between voltage VOP of output terminal VOP and voltage VOM of output terminal VOM. The non-inverting input terminal of amplifier A410 receives reference voltage VCM. Amplifier A410 amplifies a potential difference between reference voltage VCM and the intermediate voltage between voltage VOM and voltage VOP, and outputs the amplified potential difference. Output voltage vcmfb of amplifier A410 is inputted to the gates of transistor M204 and transistor M203 of active load stage AL210. Common-mode feedback circuit A400 controls active load stage AL210 such that the intermediate voltage becomes equal to reference voltage VCM.

Also in the operational amplifier in accordance with the present variation, irrespective of the load driving state of driver amplifier A230, drain currents IDS of transistor M231 and transistor M232 can both be controlled to have a value that is more than or equal to quiescent current IQ, and irrespective of the load driving state of driver amplifier A330, drain currents IDS of transistor M231 and transistor M232 can both be controlled to have a value that is more than or equal to quiescent current IQ, as in the operational amplifier in accordance with the second embodiment.

It should be noted that the other exemplary configurations and the variation described in the first embodiment are also applicable to the operational amplifier in accordance with the second embodiment.

In addition, concerning the first and second embodiments and the variations thereof described above, it has been intended from the time of filing of the present application to appropriately combine the configurations described in the embodiments, including any combination which is not mentioned in the specification, within a range free of inconsistency or contradiction.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

A100: differential input stage; A200: output stage (class AB amplifier); A230, A330: driver amplifier; MS220, MS320: minimum selector; VIP: non-inverting input terminal; VIM: inverting input terminal; V1: first reference potential terminal; V2: second reference potential terminal; AL210: active load stage; AL244, AL344: active load;

A221, A321: voltage comparator; A242, A342: first transconductance amplifier; A243, A343: second transconductance amplifier; A410: amplifier; R401, R402: resistor; M0, M1, M2, M201 to M208, M2051, M2052, M2061, M2062, M2071, M2072, M2081, M2082, M220 to M228, M231, M232: transistor; A400: common-mode feedback circuit; IIP, IIM: input terminal; VO, VOP, VOM: output terminal.

The invention claimed is:

1. A class AB amplifier comprising:
a first input terminal to receive a first input current;
a second input terminal to receive a second input current;
an output terminal;
a first reference potential terminal;
a second reference potential terminal;
an active load stage to receive the first input current and the second input current, and convert the first input current and the second input current into a first voltage and a second voltage;
a driver amplifier to operate upon receiving the first voltage and the second voltage from the active load stage, and output a current to the output terminal,
the driver amplifier having a first transistor and a second transistor connected in series between the first reference potential terminal and the second reference potential terminal, and connecting a connection point between the first transistor and the second transistor to the output terminal,
the first transistor receiving the first voltage at a gate and passing a first current, and the second transistor receiving the second voltage at a gate and passing a second current; and
a minimum selector to provide feedback to the first voltage and the second voltage such that an absolute value of each of the first current and the second current becomes more than or equal to a quiescent current of the driver amplifier, wherein
when the second transistor is in a load driving state and the first transistor is in a quiescent state, the minimum selector generates a bias control voltage based on a voltage difference between the first voltage and a first reference voltage, and
when the first transistor is in the load driving state and the second transistor is in the quiescent state, the minimum selector generates the bias control voltage based on a voltage difference between the second voltage and a second reference voltage, and
the active load stage controls the first voltage and the second voltage such that a current passing through the transistor in the quiescent state becomes equal to the quiescent current, in accordance with the bias control voltage.

2. The class AB amplifier according to claim 1, wherein the minimum selector has
a voltage comparator to output a first selection control signal when the first voltage is smaller than a third reference voltage, and output a second selection control signal when the first voltage is larger than the third reference voltage,
a first transconductance amplifier to operate upon receiving the first selection control signal, and convert the voltage difference between the first voltage and the first reference voltage into a current,
a second transconductance amplifier to operate upon receiving the second selection control signal, and convert the voltage difference between the second voltage and the second reference voltage into a current, and
an active load to convert a current obtained by adding an output current of the first transconductance amplifier and an output current of the second transconductance amplifier into the bias control voltage, and output the bias control voltage to the active load stage, and
the active load stage has a differential amplifier to control the first voltage and the second voltage such that the bias control voltage matches a fourth reference voltage.

3. The class AB amplifier according to claim 2, wherein the voltage comparator has a third transistor to constitute a constant current source, a fourth transistor to receive the first voltage at a gate, and a fifth transistor to receive the third reference voltage at a gate and constitutes a differential pair with the fourth transistor,
the first transconductance amplifier has a sixth transistor to receive the first voltage at a gate, and a seventh transistor to receive the first reference voltage at a gate and constitute a differential pair with the sixth transistor,
the second transconductance amplifier has an eighth transistor to receive the second voltage at a gate, and a ninth transistor to receive the second reference voltage at a gate and constitute a differential pair with the eighth transistor, and
absolute values of threshold voltages of the sixth transistor, the seventh transistor, the eighth transistor, and the ninth transistor are smaller than absolute values of threshold voltages of the third transistor, the fourth transistor, and the fifth transistor.

4. The class AB amplifier according to claim 3, wherein the active load has a current mirror circuit constituted by a tenth transistor and an eleventh transistor,
each of the fourth transistor, the fifth transistor, the sixth transistor, the seventh transistor, the eighth transistor, and the ninth transistor is a first conductivity type transistor, and
each of the tenth transistor and the eleventh transistor is a second conductivity type transistor.

5. An operational amplifier comprising:
a differential input stage to have a non-inverting input terminal and an inverting input terminal, and convert a difference between a first potential of the non-inverting input terminal and a second potential of the inverting input terminal into the first input current and the second input current; and
an output stage to amplify a difference between the first input current and the second input current, and output a current to the output terminal,
the output stage including the class AB amplifier according to claim 1.

6. A class AB amplifier according to claim 1 comprising:
a first input terminal to receive a first input current;
a second input terminal to receive a second input current;
an output terminal;
a first reference potential terminal;
a second reference potential terminal;
an active load stage to receive the first input current and the second input current, and convert the first input current and the second input current into a first voltage and a second voltage;
a driver amplifier to operate upon receiving the first voltage and the second voltage from the active load stage, and output a current to the output terminal, the driver amplifier having a first transistor and a second transistor connected in series between the first reference potential terminal and the second reference potential terminal, and connecting a connection point between the first transistor and the second transistor to the output terminal, the first transistor receiving the first voltage at a gate and passing a first current, and the second transistor receiving the second voltage at a gate and passing a second current; and a minimum selector to provide feedback to the first voltage and the second voltage such that an absolute value of each of the first current and the second current becomes more than or equal to a quiescent current of the driver amplifier, wherein the minimum selector has a voltage comparator to output a first selection control signal when the first voltage is smaller than a third reference voltage, and output a second selection control signal when the first voltage is larger than the third reference voltage, a first transconductance amplifier to operate upon receiving the first selection control signal, and convert a voltage difference between the first voltage and a first reference voltage into a current, and a second transconductance amplifier to operate upon receiving the second selection control signal, and convert a voltage difference between the second voltage and a second reference voltage into a current, and the minimum selector inputs a current obtained by adding an output current of the first transconductance amplifier and an output current of the second transconductance amplifier to the gates of the first transistor and the second transistor.

7. An operational amplifier comprising:

a differential input stage to have a non-inverting input terminal and an inverting input terminal, and convert a difference between a first potential of the non-inverting input terminal and a second potential of the inverting input terminal into the first input current and the second input current; and an output stage to amplify a difference between the first input current and the second input current, and output a current to the output terminal, the output stage including the class AB amplifier according to claim 6.

8. A class AB amplifier comprising:

a first input terminal to receive a first input current;
a second input terminal to receive a second input current;
a first output terminal to output a first output current;
a second output terminal to output a second output current;
a first reference potential terminal;
a second reference potential terminal;
an active load stage to receive the first input current and convert the first input current into a first voltage and a second voltage, and to receive the second input current and converts the second input current into a third voltage and a fourth voltage;

a first driver amplifier to operate upon receiving the first voltage and the second voltage from the active load stage, and output the first output current to the first output terminal;

a second driver amplifier to operate upon receiving the third voltage and the fourth voltage from the active load stage, and output the second output current to the second output terminal, the first driver amplifier having a first transistor and a second transistor connected in series between the first reference potential terminal and the second reference potential terminal, and connecting a connection point between the first transistor and the second transistor to the first output terminal, the second driver amplifier having a third transistor and a fourth transistor connected in series between the first reference potential terminal and the second reference potential terminal, and connecting a connection point between the third transistor and the fourth transistor to the second output terminal, the first transistor receiving the first voltage at a gate and passing a first current, and the second transistor receiving the second voltage at a gate and passing a second current, the third transistor receiving the third voltage at a gate and passing a third current, and the fourth transistor receiving the fourth voltage at a gate and passing a fourth current;

a first minimum selector to provide feedback to the first voltage and the second voltage such that an absolute value of each of the first current and the second current becomes more than or equal to a quiescent current of the first driver amplifier; and a second minimum selector to provide feedback to the third voltage and the fourth voltage such that an absolute value of each of the third current and the fourth current becomes more than or equal to a quiescent current of the second driver amplifier.

9. An operational amplifier comprising:

a differential input stage to have a non-inverting input terminal and an inverting input terminal, and convert a difference between a first potential of the non-inverting input terminal and a second potential of the inverting input terminal into the first input current and the second input current;

an output stage to amplify the first input current and output the first output current to the first output terminal, and to amplify the second input current and output the second output current to the second output terminal; and a common-mode feedback circuit to control the output stage such that a voltage that is intermediate between a voltage of the first output terminal and a voltage of the second output terminal becomes equal to a reference voltage, the output stage including the class AB amplifier according to claim 8.

* * * * *